United States Patent
Sakurai et al.

(10) Patent No.: US 8,423,931 B2
(45) Date of Patent: Apr. 16, 2013

(54) SUPPORT COMPUTER PRODUCT, APPARATUS, AND METHOD

(75) Inventors: Aya Sakurai, Kasugai (JP); Yoshio Inoue, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 263 days.

(21) Appl. No.: 12/785,480

(22) Filed: May 23, 2010

(65) Prior Publication Data

US 2010/0299645 A1 Nov. 25, 2010

(30) Foreign Application Priority Data

May 25, 2009 (JP) ................................. 2009-125302

(51) Int. Cl.
G06F 17/50 (2006.01)
(52) U.S. Cl.
USPC ........... 716/106; 716/107; 716/108; 716/113; 716/114; 716/132; 716/134
(58) Field of Classification Search .................. 716/100, 716/106–108, 111–114, 132–136
See application file for complete search history.

(56) References Cited

U.S. PATENT DOCUMENTS

| | | | |
|---|---|---|---|
| 5,619,420 A | 4/1997 | Breid | |
| 5,636,372 A | 6/1997 | Hathaway et al. | |
| 5,943,489 A | 8/1999 | Shiratori | |
| 7,694,242 B1 * | 4/2010 | Li et al. .......................... | 716/100 |
| 7,818,695 B2 * | 10/2010 | Byrn et al. .................... | 716/103 |
| 2007/0106966 A1 | 5/2007 | Inoue et al. | |

FOREIGN PATENT DOCUMENTS

| | | |
|---|---|---|
| JP | 8-129568 A | 5/1996 |
| JP | 9-107035 A | 4/1997 |
| JP | 9-265488 A | 10/1997 |
| JP | 2002-342400 A | 11/2002 |
| JP | 2004-005578 A | 1/2004 |
| JP | 2004-334468 A | 11/2004 |
| JP | 2005-019524 A | 1/2005 |
| JP | 2007-95028 A | 4/2007 |
| JP | 2007-133497 A | 5/2007 |
| JP | 2009-075822 A | 4/2009 |
| WO | WO-2004-046975 A1 | 6/2004 |

OTHER PUBLICATIONS

Japanese Office Action mailed Jan. 22, 2013 for corresponding Japanese Application No. 2009-125302, with English-language Translation.

* cited by examiner

*Primary Examiner* — Paul Dinh
(74) *Attorney, Agent, or Firm* — Fujitsu Patent Center

(57) ABSTRACT

A computer-readable recording medium stores a design support program causing a computer to perform: detecting a data path and a clock path corresponding to the data path making up a partial circuit in a circuit-under-design; selecting an object cell from cells on the data path and the clock path detected in the detecting; replacing the object cell selected in the selecting with a cell having a function substantially identical to and characteristics different from the object cell; acquiring a plurality of types of characteristic information related to the partial circuit based on the data path and the clock path after the object cell is replaced in the replacing; determining whether the types of the characteristic information acquired in the acquiring is in violation of restrictions; and outputting a determination result determined in the determining.

15 Claims, 17 Drawing Sheets

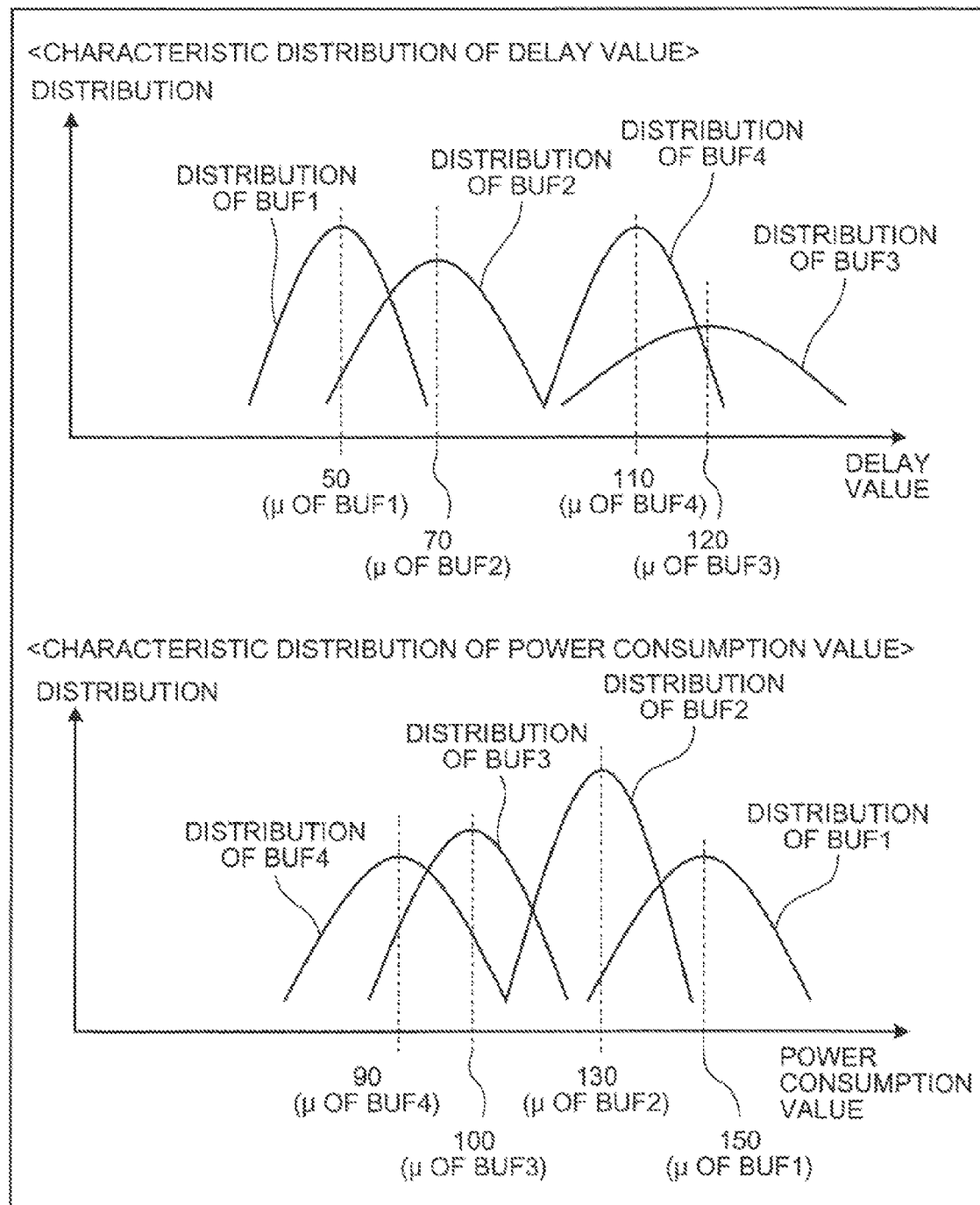

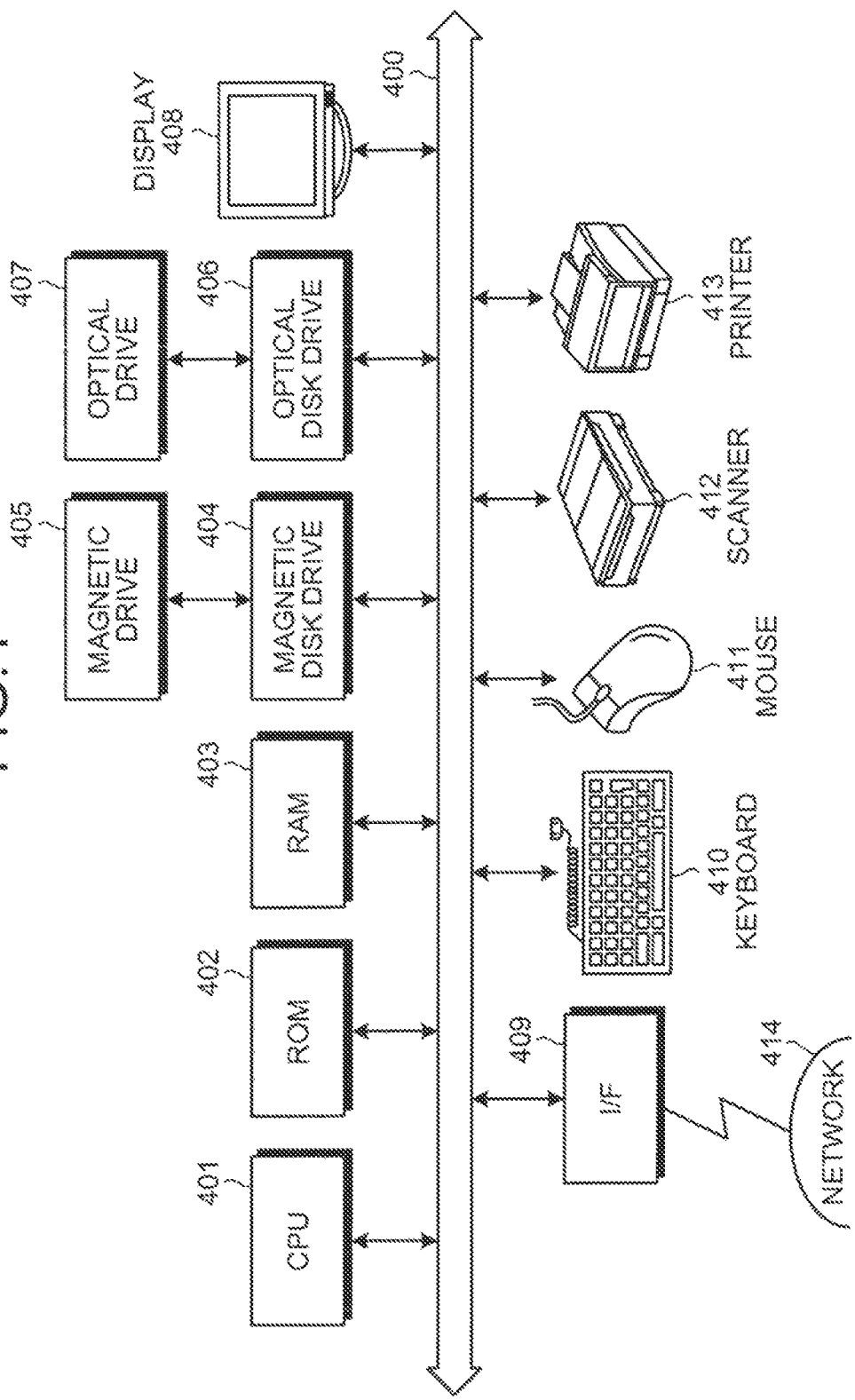

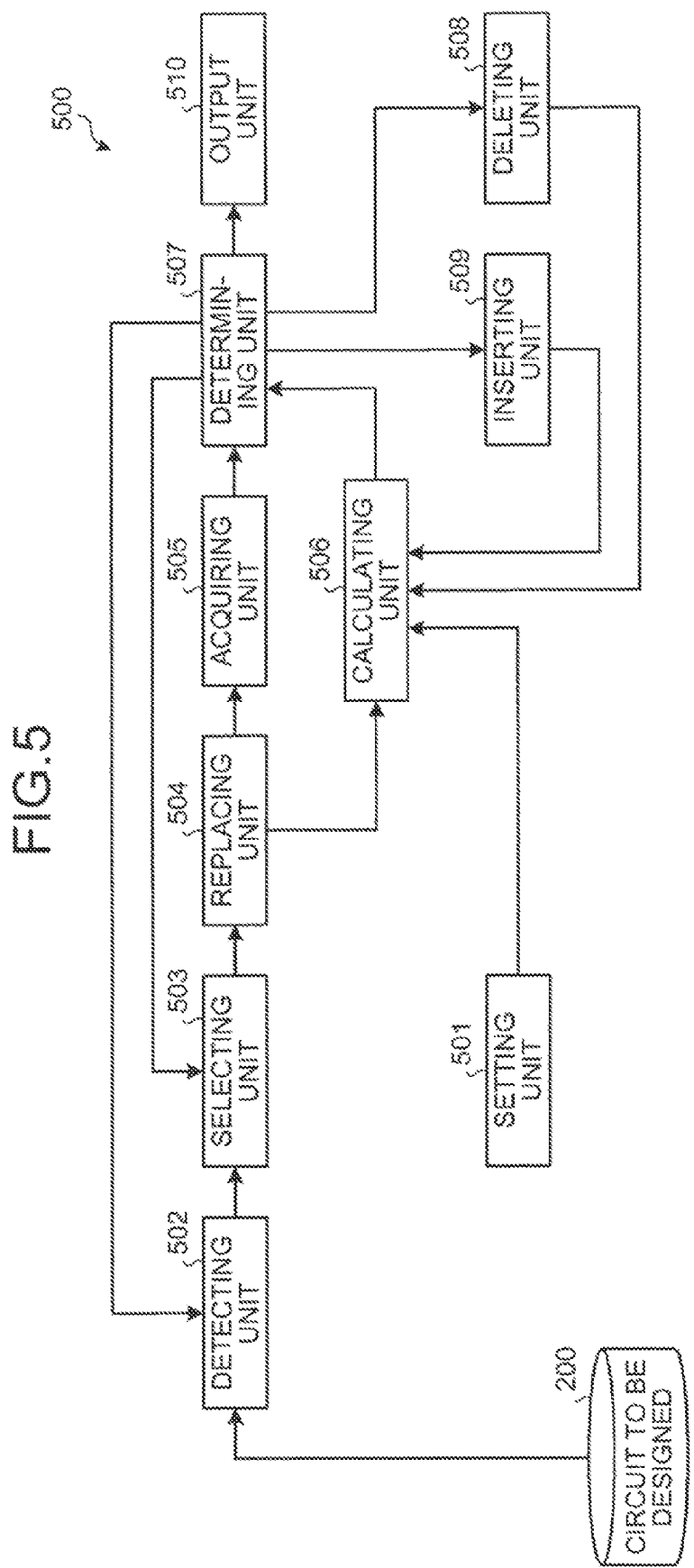

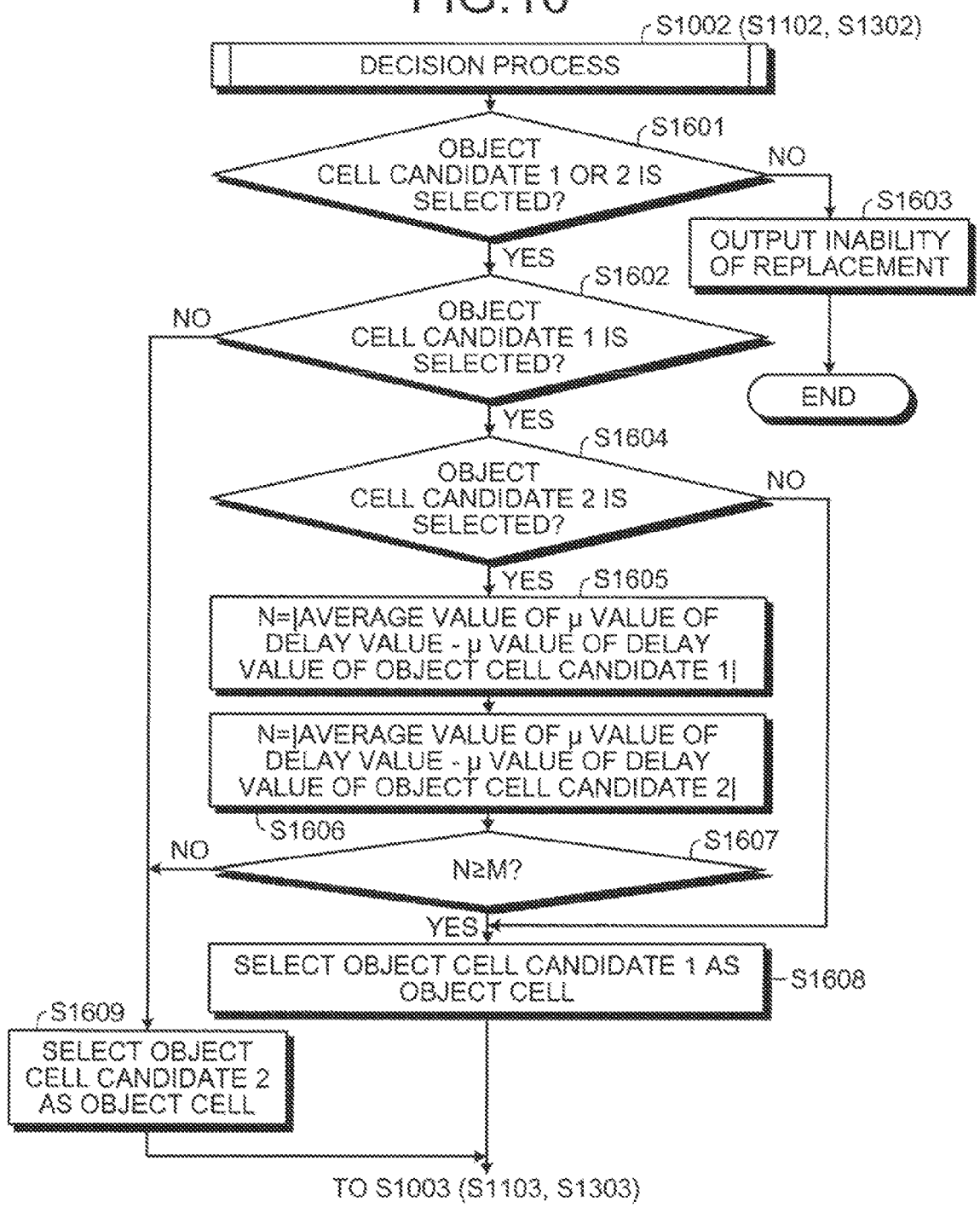

SUPPORT COMPUTER PRODUCT, APPARATUS, AND METHOD

CROSS REFERENCE TO RELATED APPLICATIONS

This application is based upon and claims the benefit of priority of the prior Japanese Patent Application No. 2009-125302, filed on May 25, 2009, the entire contents of which are incorporated herein by reference.

FIELD

The embodiments discussed herein are related to design support for automated design of semiconductor integrated circuits.

BACKGROUND

Conventionally, whether timing characteristics of a circuit-under-design conform to a standardized value is determined by a simulation based on a resistance value and a capacitance value from wiring information after layout design. The timing characteristics are characteristics of set-up timing and hold timing, for example. A technique has been known that changes the size of a cell in the circuit-under-design to make the timing characteristics and the power consumption value characteristics of the circuit-under-design conform to standardized values (hereinafter, "conventional technology 1") (see, e.g., Japanese Patent Laid-Open Publication Nos. 2004-5578 and H9-107035). A technique has been known that performs design such that a power consumption value conforms to a standardized value in a circuit-under-design having the timing characteristics conforming to a standardized value (hereinafter, "conventional technology 2") (see, e.g., Japanese Patent Laid-Open Publication No. 2002-342400).

Variations occur in the characteristics of cells of a circuit-under-design and the characteristics of the circuit-under-design due to factors at manufacture. Therefore, a technique has been known that calculates the characteristics distribution of the cells and the characteristics distribution of the circuit-under-design with a polynomial equation (see, e.g., Japanese Patent Laid-Open Publication No. 2007-133497). A technique has also been known that performs a simulation with consideration of the variations (see, e.g., Japanese Patent Laid-Open Publication Nos. H9-265488 and 2005-19524).

However, cell size is changed while a layout is being designed in conventional technology 1. The process is executed after the layout design in conventional technology 2. For example, since the layout design is performed again if a change is made in a circuit-under-design, it is problematic that the layout design requires considerable effort, which makes design difficult. The technique of performing a simulation with consideration of the variations is unable to perform the design with consideration for variations of characteristics. Therefore, since multiple types of characteristics are not necessarily related, it is difficult to make multiple types of characteristics conform to the standardized values of the respective characteristics.

SUMMARY

According to an aspect of an embodiment, a computer-readable recording medium stores a design support program causing a computer to perform detecting a data path and a clock path corresponding to the data path making up a partial circuit in a circuit-under-design; selecting an object cell from cells on the data path and the clock path detected in the detecting; replacing the object cell selected in the selecting with a cell having a function substantially identical to and characteristics different from the object cell; acquiring a plurality of types of characteristic information related to the partial circuit based on the data path and the clock path after the object cell is replaced in the replacing; determining whether the types of the characteristic information acquired in the acquiring is in violation of restrictions; and outputting a determination result determined in the determining.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A is an explanatory diagram of an example of characteristic distributions of cells.

FIG. 4 is a block diagram of a hardware configuration of a design support apparatus.

FIG. 5 is a block diagram of a functional configuration of the design support apparatus.

FIG. 16 is a flowchart of the detailed process procedure of a decision process.

DESCRIPTION OF EMBODIMENTS

Embodiments of the present invention will be explained with reference to the accompanying drawings. In a first embodiment, an arbitrary cell is selected from an arbitrary data path and a clock path corresponding to the data path in a circuit-under-design. Description will be made of an example of replacing the cell type of the selected cell to make multiple types of characteristics conform to standardized values of the respective characteristics and to determine whether a margin exists for a standardized value as compared to a margin before the replacement.

Second to fourth embodiments describe examples of selecting an object cell from a path having a hold timing slack characteristics distribution that does not conform to the hold timing standardized value and replacing the cell type of the selected cell to make multiple types of characteristics conform to the standardized values of the respective characteristics. The second embodiment describes an example of replacing the cell type of the object cell with a cell type determined based on σ of a delay value characteristics distribution from multiple cell types.

The third embodiment describes an example of replacing the cell type of the object cell with a cell type determined based on μ of the delay value characteristics distribution from multiple cell types. Lastly, the fourth embodiment describes an example of replacing the cell type of the object cell with a cell type determined based on μ of a power consumption value characteristics distribution from multiple cell types.

The first to fourth embodiments will hereinafter be described with reference to the accompanying drawings.

Figure 1:
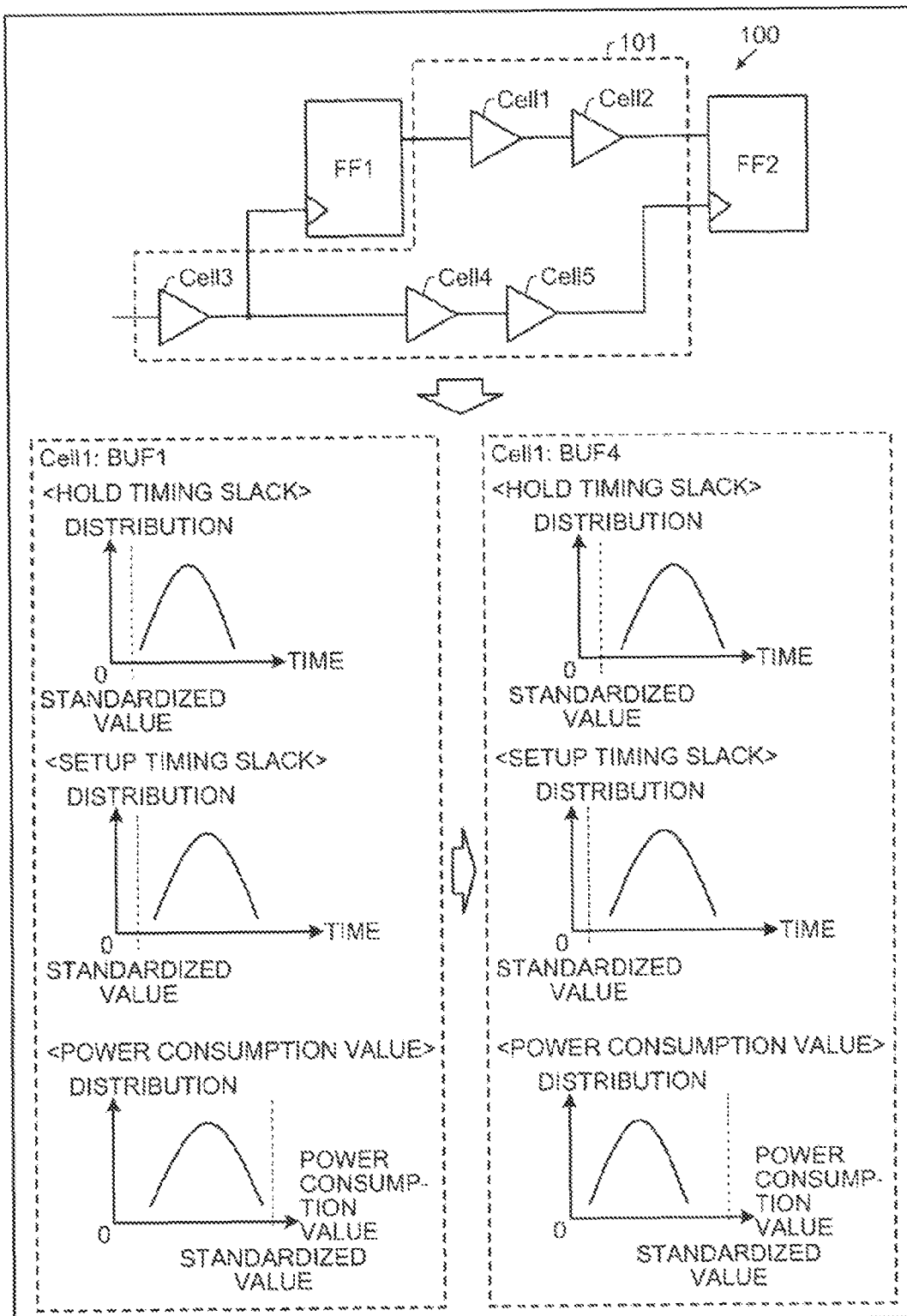
FIG. 1 is an explanatory diagram of one example of a first embodiment.

FIG. 1 is an explanatory diagram of one example of the first embodiment. A circuit-under-design 100 has cells initially arranged and corresponds to circuit information of a partial circuit after clock tree synthesis. For example, Cell1 has a cell type of BUF1. The hold timing slack characteristics distribution and the setup timing slack characteristics distribution of a path 101 are calculated based on the characteristic distributions of delay values of Cell1 to Cell5 in the circuit-under-design 100. The power consumption value characteristics distribution of the path 101 is calculated based on the characteristic distributions of power consumption values of Cell1 to Cell5 in the circuit-under-design 100. The path 101 represents a data path and a clock path corresponding to the data path that constitute the circuit-under-design 100.

For example, when the cell type of BUF1 of Cell1 is replaced with BUF4, the characteristic distributions of the path 101 of the circuit-under-design 100 are calculated again. It is then determined whether the characteristic distributions of the path 101 conform to the standardized values of the respective characteristics. Alternatively, it is determined whether at least selected characteristics of the path 101 have a margin from the standardized value larger than that of the specified characteristic distribution before the replacement. For example, the power consumption value characteristic distribution has a larger margin from the standardized value as compared to before the replacement, and thus Cell1 is determined as BUF4.

This enables characteristic information in violation of the restriction to be identified by the replacement of cells from multiple types of characteristic information of a circuit-under-design irrespective of correlation between the different types. Therefore, a type of characteristics in violation may be detected from multiple types of characteristic information and a partial circuit may be improved by improving the respective characteristics.

Figure 2:
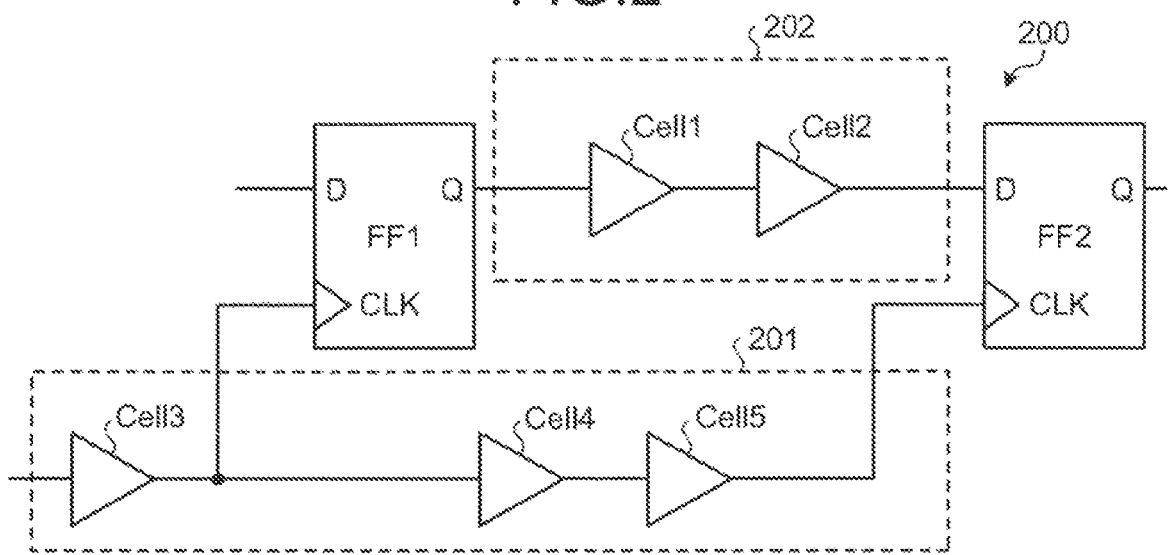
FIG. 2 is an explanatory diagram of an example of a circuit-under-design.

FIG. 2 is an explanatory diagram of an example of a circuit-under-design. A circuit-under-design 200 represents a partial circuit within a semiconductor integrated circuit. The circuit-under-design 200 includes FF1 and FF2, a clock path 201, a data path 202, Cell3 to Cell5 that are buffers on the clock path 201, and Cell1 and Cell2 that are buffers on the data path 202. All the cells on the clock path 201 and the data path 202 in the circuit-under-design 200 are defined as buffers for the facilitation of understanding.

In the first embodiment, Cell1 to Cell5 are described as cell names. BUF1 to BUF4 which are described later will be described as cell types. If the cell types are the same, the similar function and the similar characteristics are achieved. Actually, the cell types are pieces of information included in circuit information such as physical information.

Although the process is actually executed by a computer accessing the circuit information such as physical information, this embodiment will be described with reference to a circuit diagram. The circuit-under-design 200 is stored in a storage device or a storage device of an accessible external computer.

FIG. 3A is an explanatory diagram of an example of characteristic distributions of cells. In the first embodiment, BUF1 to BUF 4 are used as cell types of buffers to describe the characteristic distributions of cells. The delay value characteristic distributions will first be described. The characteristic distribution of BUF1 has the median value (μ) of 50. The characteristic distribution of BUF2 has μ of 70. The characteristic distribution of BUF3 has μ of 120. Lastly, the characteristic distribution of BUF4 has μ of 110.

Figure 3B:
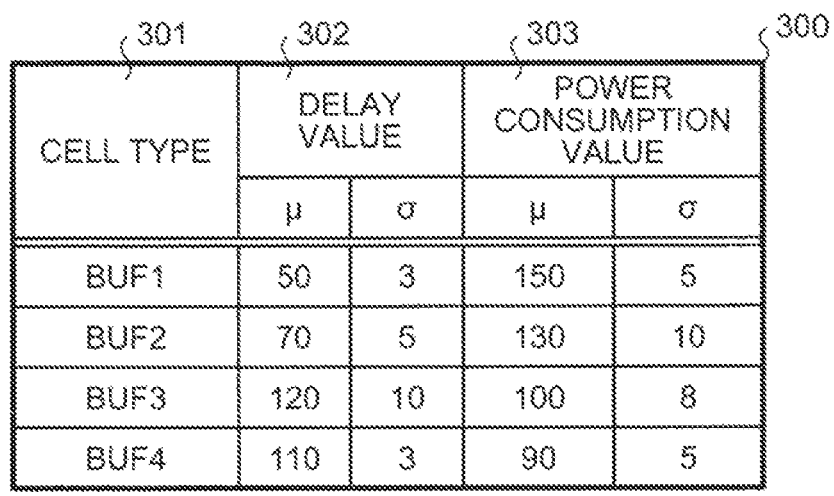
FIG. 3B is a table of $\mu$ and $\sigma$ of delay value and power consumption for every cell type.

The power consumption value characteristic distributions will then be described. The characteristic distribution of BUF1 has μ of 150. The characteristic distribution of BUF2 has μ of 130. The characteristic distribution of BUF3 has μ of 100. Lastly, the characteristic distribution of BUF4 has μ of 90. FIG. 3B depicts a table of μ and the standard deviation (σ).

FIG. 3B is an explanatory diagram of an example of μ and σ of the delay value and the power consumption of each cell type. A table 300 includes cell types 301, μ of the delay value 302, σ of the delay value 302, μ of the power consumption 303, and σ of the power consumption 303. BUF2 is taken as an example: μ of the delay value 302 is 70; μ of the power consumption 303 is 130, σ of the delay value 302 is 5; and σ of the power consumption 303 is 10. Actually, the characteristic information of each cell is prepared as a library by a user in advance and is stored in a storage device or a storage device of an accessible external computer.

An example of calculating the characteristic distribution of a path based on characteristic distributions of cells will be described. The characteristic distribution of each cell may be expressed by polynomials. Such an equation for delay values is expressed, for example, by the following Equation 1.

$$\alpha_\ell = A_0 + \sum_{m=1}^{m} A_m(a_m) \tag{1}$$

Subscript l denotes a cell type's number. This embodiment will be described with four cell types corresponding to BUF1 to BUF4. It is assumed in this embodiment that A0 to Am are determined by a user in advance and the equations for the delay values of BUF1 to BUF4 are expressed by α1 to α4, respectively. The equation for the delay value of BUF1 is expressed by α1; the equation for the delay value of BUF2 is expressed by α2; the equation for the delay value of BUF3 is expressed by α3; and the equation for the delay value of BUF4 is expressed by α4.

$\alpha 1 = 50 + 2 \times a1 + 1 \times a2$, $\alpha 2 = 70 + 1 \times a1 + 3 \times a2$, $\alpha 3 = 120 + 3 \times a1 + 2 \times a2$, $\alpha 1 = 110 + 4 \times a1 + 2 \times a2$.

a1 and a2 are normal random numbers. Therefore, μ is represented by 0 and the square of σ is represented by 1. In the case of "μ+3σ" for α1, 3 is substituted into a1 and a2. Therefore, the value of "μ+3σ" of α1 is 59. α1 to α4 are stored in a storage device or a storage device of an accessible external computer.

An equation for power consumption is, for example, expressed by the following Equation 2.

$$\beta_l = B_0 + \sum_{m=1}^{m} B_m(b_m) \tag{2}$$

Subscript 1 denotes a cell type's number as above. It is assumed in this embodiment that B0 to Bm are determined by a user in advance and the equations for the power consumption of BUF1 to BUF4 are expressed by β1 to β4. The equation for the power consumption of BUF1 is expressed by β1; the equation for the power consumption of BUF2 is expressed by β2; the equation for the power consumption of BUF3 is expressed by β3; and the equation for the power consumption of BUF4 is expressed by β4.

β1=150+1×b1+2×b2,

β2=130+4×b1+8×b2,

β3=100+2×b1+1×b2,

β4=90+1×b1+2×b2.

b1 and b2 are normal random numbers. Therefore, μ is represented by 0 and the square of σ is represented by 1. In the case of "μ+3σ" for β1, 3 is substituted into b1 and b2. Therefore, the value of "μ+3σ" of β1 is 159. β1 to β4 are stored in a storage device or a storage device of an accessible external computer.

The hold timing slack will then be described. In FIG. 2, the hold timing slack is a time period from the rising edge of a clock signal input to FF2 until a data signal input to FF2 changes. The hold timing slack characteristic distribution is calculated by a polynomial equation based on equations for the delay values of the cells on the data path and the clock path corresponding to the data path. An equation for calculating the hold timing slack characteristic distribution is, for example, expressed by the following Equation 3.

$$X = x_0 + \sum_{n=1}^{n} x_n H(\alpha_n) \tag{3}$$

In Equation 3, α1 to αn are the equations for the delay values of the cells on the data path and the clock path corresponding to the data path making up the partial circuit. In the first embodiment, α1 of Equation 3 represents the equation of the delay value of Cell1 in the circuit-under-design 200. Therefore, in this embodiment, n takes a value from 1 to 5 corresponding to Cell1 to Cell5. The first embodiment will be described with the assumption that x0 to xn of Equation 3 are determined by a user as expressed by the following Equation 4. The following Equation 4 represents the equation for calculating the hold timing slack characteristic distribution based on the data path 202 and the clock path 201 in the circuit-under-design 200.

X=100+0.2×(equation for delay value of Cell1)+0.3×(equation for delay value of Cell2)+0.4×(equation for delay value of Cell3)+0.5×(equation for delay value of Cell4)+0.6×(equation of delay value of Cell5) (4)

The setup timing slack will then be described. With reference to FIG. 2, the setup timing slack is a time period from the change in the data signal input to FF2 to the rising edge of the clock signal input to FF2. The setup timing slack characteristic distribution is calculated by a polynomial equation based on the characteristic distribution of the delay values of the cells on the data path and the clock path corresponding to the data path. An example of an equation for calculating the setup timing slack characteristic distribution is expressed by Equation 5.

$$Y = y_0 + \sum_{n=1}^{n} y_n H(\alpha_n) \tag{5}$$

In Equation 5, αn is the equation of the delay values of the cells on the data path and the clock path corresponding to the data path making up the partial circuit. In the first embodiment, α1 of Equation 5 represents the equation of the delay value of Cell1 in the circuit-under-design 200. The first embodiment will be described with the assumption that y0 to yn of Equation 5 are determined by a user as expressed by the following Equation 6. The following Equation 6 represents the equation for calculating the setup timing slack characteristic distribution based on the data path 202 and the clock path 201 in the circuit-under-design 200.

Y=150+0.2×(equation for delay value of Cell1)+0.4×(equation for delay value of Cell2)+0.6×(equation for delay value of Cell3)+0.8×(equation for delay value of Cell4)+1.0×(equation for delay value of Cell5) (6)

The power consumption value characteristic distribution will then be described. The power consumption value characteristic distribution is calculated by a polynomial equation based on the characteristic distribution of the power consumption of the cells on the data path and the clock path corresponding to the data path. An equation for calculating the power consumption value characteristic distribution is, for example, expressed by the following Equation 7.

$$Z = z_0 + \sum_{n=1}^{n} z_n H(\beta_n) \tag{7}$$

In Equation 7, βn is the equation of the power consumption values of the cells on the data path and the clock path corresponding to the data path making up the partial circuit. In the first embodiment, β1 of Equation 7 represents the equation of the power consumption of Cell1 in the circuit-under-design 200. The first embodiment will be described with the assumption that z0 to zn of Equation 7 are determined by a user as expressed by the following Equation 8. The following Equation 8 represents the equation for calculating the power consumption value characteristic distribution based on the data path 202 and the clock path 201 in the circuit-under-design 200.

Z=300+0.3×(equation for power consumption of Cell1)+0.4×(equation for power consumption of Cell2)+0.5×(equation for power consumption of Cell3)+0.6×(equation for power consumption of Cell4)+0.7×(equation for power consumption of Cell5) (8)

Equation 4, Equation 6, and Equation 8 are equations modeled by a user in accordance with a partial circuit after the initial arrangement and the clock tree are established. The equations are stored in a storage device or a storage device of an accessible external computer.

FIG. 4 is a block diagram of a design support apparatus. As depicted in FIG. 4, the design support apparatus includes a central processing unit (CPU) 401, a read-only memory (ROM) 402, a random access memory (RAM) 403, a magnetic disk drive 404, a magnetic disk 405, an optical disk drive 406, an optical disk 407, a display 408, an interface (I/F) 409, a keyboard 410, a mouse 411, a scanner 412, and a printer 413, coupled to one another by way of a bus 400.

The CPU 401 governs overall control of the design support apparatus. The ROM 402 stores therein programs such as a boot program. The RAM 403 is used as a work area of the CPU 401. The magnetic disk drive 404, under the control of the CPU 401, controls reading/writing of data from or to the magnetic disk 405. The magnetic disk 405 stores therein the data written under control of the magnetic disk drive 404.

The optical disk drive 406, under the control of the CPU 401, controls reading/writing of data from or to the optical disk 407. The optical disk 407 stores therein the data written under control of the optical disk drive 406, the data being read by the computer.

The display 408 displays a cursor, an icon, or a toolbox as well as data such as documents, images, and information on function. The display 408 may be, for example, a cathode ray tube (CRT), a thin-film-transistor (TFT) liquid crystal display, or a plasma display.

The I/F 409 is coupled to a network 414 such as the Local Area Network (LAN), the Wide Area Network (WAN), and the Internet through a telecommunication line and is coupled to other devices by way of the network 414. The I/F 409 manages the network 414 and an internal interface, and controls the input and output of data from or to external devices. The I/F 409 may be, for example, a modem or a LAN adapter.

The keyboard 410 is equipped with keys for the input of characters, numerals, and various instructions, and data is entered through the keyboard 410. The keyboard 410 may be a touch-panel input pad or a numeric keypad. The mouse 411 performs cursor movement, range selection, and movement, size change, etc., of a window. The mouse 411 may be a trackball or a joystick provided the trackball or joystick has similar functions as a pointing device.

The scanner 412 optically reads an image and takes in the image data into the design support apparatus. The scanner 412 may have an optical character recognition (OCR) function as well. The printer 413 prints image data and document data. The printer 413 may be, for example, a laser printer or an ink jet printer.

FIG. 5 is a block diagram of a functional configuration of the design support apparatus. A design support apparatus 500 includes a setting unit 501, a detecting unit 502, a selecting unit 503, a replacing unit 504, an acquiring unit 505, a calculating unit 506, a determining unit 507, a deleting unit 508, an inserting unit 509, and an output unit 510. For example, the functions (the setting unit 501 to the output unit 510) are implemented, for example, by causing the CPU 401 to execute programs stored in the storage device such as the ROM 402, the RAM 403, the magnetic disk 405, and the optical disk 407, or the functions are implemented through the I/F 409.

The first embodiment will be described by way of example with a hold timing standardized value (Dhd_st), a setup timing standardized value (Dsu_st), and a power consumption standardized value (P_st) taking the following values.
Dhd_st: 185,
Dsu_st: 250,
P_st: 750.

The standardized values of the respective characteristics are stored in the storage device such as the RAM 403, the magnetic disk 405, and the optical disk 407.

The following "cell name: cell type" represents an example of a cell type assigned to each of the cells within the circuit-under-design 200. Actually, the circuit information includes the information concerning the cell types of the respective cells.
Cell1: BUF1,
Cell2: BUF1,
Cell3: BUF1,
Cell4: BUF1,
Cell5: BUF1.

The detecting unit 502 has a function of detecting a data path and a clock path corresponding to the data path making up a partial circuit within a circuit-under-design. For example, for example, the CPU 401 detects an arbitrary data path 202 and the clock path 201 corresponding to the data path 202 from the circuit-under-design 200.

The selecting unit 503 has a function of selecting an object cell from cells on the data path and the clock path detected by the detecting unit 502. For example, for example, the CPU 401 selects an arbitrary cell as the object cell from the data path 202 and the clock path 201. For example, Cell1 is selected as the object cell.

The replacing unit 504 has a function of replacing the object cell selected by the selecting unit 503 with a cell having the function substantially identical to and the characteristics different from the object cell. For example, for example, the CPU 401 replaces the cell type of Cell1 with an arbitrary cell type having the function substantially identical to and the characteristics different from the cell type of Cell1, which is the object cell. For example, the cell type of Cell1 is BUF1 as described above. Therefore, the cell type BUF1 of Cell1 is replaced with an arbitrary cell type in the table 300 except BUF1. For example, the cell type BUF1 of Cell1 is replaced with BUF2. The replacement result is stored in the storage device such as the RAM 403, the magnetic disk 405, and the optical disk 407.

The result of the replacement is described with "cell names: cell types" as follows.
Cell1: BUF2,
Cell2: BUF1,
Cell3: BUF1,
Cell4: BUF1,
Cell5: BUF1.

The acquiring unit 505 has a function of acquiring multiple types of characteristic information related to the partial circuit based on the data path and the clock path after the object cell is replaced by the replacing unit 504. The characteristic information represents characteristic distributions calculated by using polynomial equations. For example, for example, the CPU 401 acquires the hold timing slack characteristic distribution, the setup timing slack characteristic distribution, and the power consumption value characteristic distribution calculated by above Equations 4, 6, and 8 based on the circuit-under-design 200 in which the replacement has been performed.

For example, multiple types of the characteristic distributions will be described below that is calculated based on the characteristics of the cells on the path in which the object cell has been replaced.

The hold timing slack characteristic distribution calculated by using above Equation 4 will be described as X0 below. An example of substituting the equations of the delay values of the cells into X of above Equation 4 is as follows:

$$X0=100+0.2\times(70+1\times a1+3\times a2)+0.3\times(50+2\times a1+1\times a2)+0.4\times(50+2\times a1+1\times a2)+0.5\times(50+2\times a1+1\times a2)+0.6\times(50+2\times a1+1\times a2).$$

The calculation result is as follows:

$$X0=204+3.8\times a1+2.4\times a2.$$

The setup timing slack characteristic distribution calculated by using above Equation 6 will be described as Y0 below. An example of substituting the equations of the delay values of the cells into Equation 6 is as follows:

$$Y0=150+0.2\times(70+1\times a1+3\times a2)+0.4\times(50+2\times a1+1\times a2)+0.6\times(50+2\times a1+1\times a2)+0.8\times(50+2\times a1+1\times a2)+1.0\times(50+2\times a1+1\times a2).$$

The calculation result is as follows:

$$Y0=304+5.8\times a1+3.4\times a2.$$

The power consumption calculated by using above Equation 8 will be described as Z0 below. An example of substituting the equations of the delay values of the cells into Equation 8 is as follows:

$$Z0=300+0.3\times(130+4\times b1+8\times b2)+0.4\times(150+1\times b1+2\times b2)+0.5\times(150+1\times b1+2\times b2)+0.6\times(150+1\times b1+2\times b2)+0.7\times(150+1\times b1+2\times b2).$$

The calculation result is as follows:

$$Z0=657+3.4\times b1+6.8\times b2.$$

Equations 4, 6, and 8 are equations expressing normal distributions as described above. It is assumed in this embodiment that the characteristic distributions satisfy the standardized values in the case of "$\mu\pm3\sigma$". Actually, "$\mu\pm3\sigma$" is one example, and a user may make various changes such as "$\mu\pm\sigma$" or "$\mu\pm4\sigma$". For the hold timing slack characteristic distribution, the fastest value is compared with the standardized value. Therefore, if "$\mu-3\sigma$" of the hold timing slack characteristic distribution is at least equal to the standardized value of the hold timing, the hold timing slack characteristic distribution conforms to the standardized value.

Therefore, −3 is substituted into a1 and a2 of X0 above. The calculation result of X0 is as follows:

$$X0=185.4.$$

For the setup timing slack characteristic distribution, the fastest value is compared with the standardized value. Therefore, if "$\mu-3\sigma$" of the setup timing slack characteristic distribution is at least equal to the standardized value of the setup timing, the setup timing slack characteristic distribution conforms to the standardized value.

Therefore, −3 is substituted into a1 and a2 of Y0 above. The acquisition result of Y0 is as follows:

$$Y0=276.4.$$

For the power consumption value characteristic distribution, the maximum value of the characteristic distribution is compared with the standardized value. Therefore, if "$\mu+3\sigma$" of the power consumption value characteristic distribution is at most equal to the standardized value of the power consumption value, the power consumption value characteristic distribution conforms to the standardized value.

Therefore, +3 is substituted into b1 and b2 of Z0 above. The acquisition result of Z0 is as follows:

$$Z0=687.6.$$

Although multiple characteristic distributions are acquired in this description, the characteristic distributions may be calculated by the calculating unit 506 in the design support apparatus 500.

The calculating unit 506 has a function of calculating multiple types of characteristic information related to the partial circuit based on the data path and the clock path after the object cell is replaced by the replacing unit 504.

For example, the CPU 401 acquires the equations of the delay values based on the cell types of the cells in the circuit-under-design 200 and substitutes the equations into Equation 4 and Equation 6 to calculate the equation for the hold timing slack and the equation for the setup timing slack. The equations for the power consumption are acquired based on the cell types of the cells in the circuit-under-design 200 and are substituted into Equation 8 for calculation. The calculation results are stored in the storage device such as the RAM 403, the magnetic disk 405, and the optical disk 407.

As a result, multiple types of the characteristic distributions related to the partial circuit is automatically calculated based on the characteristic distributions of the cells on the data path and the clock path corresponding to the data path making up the partial circuit. Therefore, the characteristics that do not conform to the standardized value may be identified.

The determining unit 507 has a function of determining whether the violation of the respective standardized values is made by multiple types of the characteristic information concerning the partial circuit acquired by the acquiring unit 505 (or multiple types of the characteristic information calculated by the calculating unit 506). First, the function of the determining unit 507 will be described as to determining whether the hold timing slack characteristic distribution conforms to the standardized value.

For example, the CPU 401 determines whether a value of the hold timing slack characteristic distribution at "$\mu-3\sigma$" is at least equal to Dhd_st. If the value of the characteristic distribution at "$\mu-3\sigma$" is at least equal to Dhd_st, it is determined that the standardized value is conformed and if the value of the characteristic distribution at "$\mu-3\sigma$" is less than Dhd_st, it is determined that the standardized value is violated. The value of the hold timing slack characteristic distribution at "$\mu-3\sigma$" is 185.4. Dhd_st is 185.

Therefore, it is determined that X0 is greater than Dhd_st and it is determined that the hold timing slack characteristic distribution conforms to the standardized value of the hold timing. The determination result is stored in the storage device such as the RAM 403, the magnetic disk 405, and the optical disk 407.

The function of the determining unit 507 will then be described as to determining whether the setup timing slack characteristic distribution conforms to the standardized value. For example, for example, the CPU 401 determines whether a value of the setup timing slack characteristic distribution at "$\mu-3\sigma$" is at least equal to Dsu_st. If the value of the characteristic distribution at "$\mu-3\sigma$" is at least equal to Dsu_st, it is determined that the standardized value is conformed and if the value of the characteristic distribution at "$\mu-3\sigma$" is less than Dsu_st, it is determined that the standardized value is violated.

The value of the setup timing slack characteristic distribution at "$\mu-3\sigma$" is 276.4 as explained above. The standardized value Dsu_st of the setup timing is 250. Since Y0 is greater than Dsu_st, it is determined that the setup timing slack characteristic distribution conforms to the standardized value of the setup timing. The determination result is stored in the storage device such as the RAM 403, the magnetic disk 405, and the optical disk 407.

Lastly, the function of the determining unit 507 will be described as to determining whether the power consumption value conforms to the standardized value. For example, for example, the CPU 401 determines whether a value of the power consumption value characteristic distribution at "$\mu+3\sigma$" is at most equal to P_st. If the value of the characteristic distribution at "$\mu+3\sigma$" is at most equal to P_st, it is determined that the standardized value is conformed and if the value of the characteristic distribution at "$\mu+3\sigma$" is greater than P_st, it is determined that the standardized value is violated.

The value of the power consumption value characteristic distribution at "$\mu+3\sigma$" is 687.6 as explained above. The standardized value P_st of the power consumption value is 750. Since Z0 is less than P_st, it is determined that the power consumption value characteristic distribution conforms to the standardized value of the power consumption value. The determination result is stored in the storage device such as the RAM 403, the magnetic disk 405, and the optical disk 407.

Therefore, the hold timing slack characteristic distribution, the setup timing slack characteristic distribution, and the power consumption value characteristic distribution after the replacement conform to the standardized values of the respective characteristics.

The determining unit 507 has a function of determining whether the characteristic distribution after the replacement acquired by the acquiring unit 505 has a margin from the standardized value larger than a margin of the characteristic distribution before the replacement. For example, description will be made of the case when a user specifies that the replacement is performed such that at least the power consumption value has a larger margin from the standardized value than that of the characteristic distribution before the replacement.

For example, the CPU 401 calculates a value obtained by subtracting a value of the power consumption value characteristic distribution at "$\mu+3\sigma$" before the replacement from P_st and defines the value as a first calculation result. A value is then calculated by subtracting a value of the power consumption value characteristic distribution at "$\mu+3\sigma$" after the replacement from P_st and is defined as a second calculation result. It is then determined whether the second calculation result is a value larger than the first calculation result.

For example, the CPU 401 determines that the characteristic distribution after the replacement has a larger margin from the standardized value than that of the characteristic distribution before the replacement if the second calculation result is a value larger than the first calculation result. On the contrary, if the second calculation result is at most equal to the first calculation result, it is determined that the characteristic distribution after the replacement has a smaller margin from the standardized value than that of the characteristic distribution before the replacement. Although a value at "$\mu+3\sigma$" is used in the description, this may variously be modified in such a way that the determination is made with a value at "$\mu$" instead of "$\mu+3\sigma$".

For example, description will then be made of the case when a user specifies that the replacement is performed such that at least the hold timing slack characteristic distribution has a larger margin from the standardized value than that of the characteristic distribution before the replacement.

For example, the CPU 401 calculates a value obtained by subtracting a value of the hold timing slack characteristic distribution at "$\mu-3\sigma$" before the replacement from Dhd_st and defines the value as a first calculation result. A value is then calculated by subtracting a value of the hold timing slack characteristic distribution at "$\mu-3\sigma$" after the replacement from Dhd_st and is defined as a second calculation result. It is then determined whether the second calculation result is less than the first calculation result.

For example, the CPU 401 determines that the hold timing slack characteristic distribution after the replacement has a larger margin with respect to the standardized value than that of the hold timing slack characteristic distribution before the replacement if the second calculation result is less than the first calculation result. On the contrary, if the second calculation result is at least the first calculation result, it is determined that the hold timing slack characteristic distribution after the replacement has a smaller margin with respect to the standardized value than that of the hold timing slack characteristic distribution before the replacement. The determination result is stored in the storage device such as the RAM 403, the magnetic disk 405, and the optical disk 407. Although a value at "$\mu-3\sigma$" is used in the description, this may variously be modified in such a way that the determination is made with a value at "$\mu$".

This enables multiple types of the characteristic distributions to conform to the standardized values and enables the optimization of the characteristic distribution of the type specified by a user.

The replacing unit 504 has a function of newly replacing the cell with a cell from multiple cells having the function substantially identical to and the characteristics different from the object cell except the already replaced cell if the determining unit 507 determines that at least one type of characteristic information is in violation of the restriction of the characteristic information. The replacing unit 504 also has a function of replacing the cell with a new cell from a plurality of cells having the function substantially identical to and the characteristics different from the object cell if it is determined that the characteristic information of the type specified by the determining unit 507 has a smaller margin from the restriction of the characteristic information than the characteristic information before the replacement.

For example, for example, the CPU 401 may register the cell types of the replaced cells on a list to determine whether a cell type is already replaced based on whether the cell type is included in the list. If Cell1 is the object cell, BUF4 and BUF2 are registered in the already-replaced list.

For example, for example, the CPU 401 replaces the cell type of the object cell with a cell type from the cell types on the table 300 except the cell types included in the already-replaced list. For example, the cell type BUF2 of the Cell1 is replaced with BUF3. The replacement result is stored in the storage device such as the RAM 403, the magnetic disk 405, and the optical disk 407.

By repeating the processes of the acquiring unit 505 and the determining unit 507 again, multiple pieces of the characteristic information may be reduce if not prevented from violating the respective restrictions, and the respective characteristics may be optimized.

The selecting unit 503 has a function of newly selecting the object cell from the cells on the data path and the clock path detected by the detecting unit 502 if the determination unit 507 determines that at least one type of the characteristic information is in violation of the restriction of the characteristic information. The selecting unit 503 has a function of newly selecting the object cell from the cells on the path detected by the detecting unit 502 if it is determined that the characteristic information of the type specified by the determining unit 507 has a smaller margin from the restriction of the characteristic information than the characteristic information before the replacement. For example, for example, the CPU 401 newly selects a cell from the cells on the data path 202 except Cell1 as the object cell. Since reduce if not prevent Cell2 exists as the cell on the data path 202 except Cell1, Cell2 is selected.

By repeating the processes of the replacing unit 504, the acquiring unit 505, and the determining unit 507 again, a plurality of pieces of the characteristic information may be reduce if not prevented from violating the respective restrictions and the respective characteristics may be optimized.

The output unit 510 has a function of outputting the determination result determined by the determining unit 507. For example, the CPU 401 outputs and stores the cell types of the cells into the circuit information if it is determined that multiple types of the characteristic information conforms to the respective standardized values of the characteristic information. For example, the CPU 401 outputs the inability to conform to the standardized value if it is determined that at least one of multiple types of the characteristic information does not conform to the standardized value.

The output format may be: display on the display 408; print output to the printer 413; and transmission to an external apparatus through the I/F 409. The output may be stored in the storage device such as the RAM 403, the magnetic disk 405, and the optical disk 407.

This enables characteristic information in violation of the restriction to be identified by the replacement of cells from multiple types of characteristic information of a circuit-under-design irrespective of correlation between the different types. Therefore, a type of characteristics in violation may be detected from multiple types of characteristic information and a partial circuit may be improved by improving the respective characteristics.

Although not described in detail in the first embodiment, the setting unit 501 will be described in detail in second to third embodiments.

Figure 6:
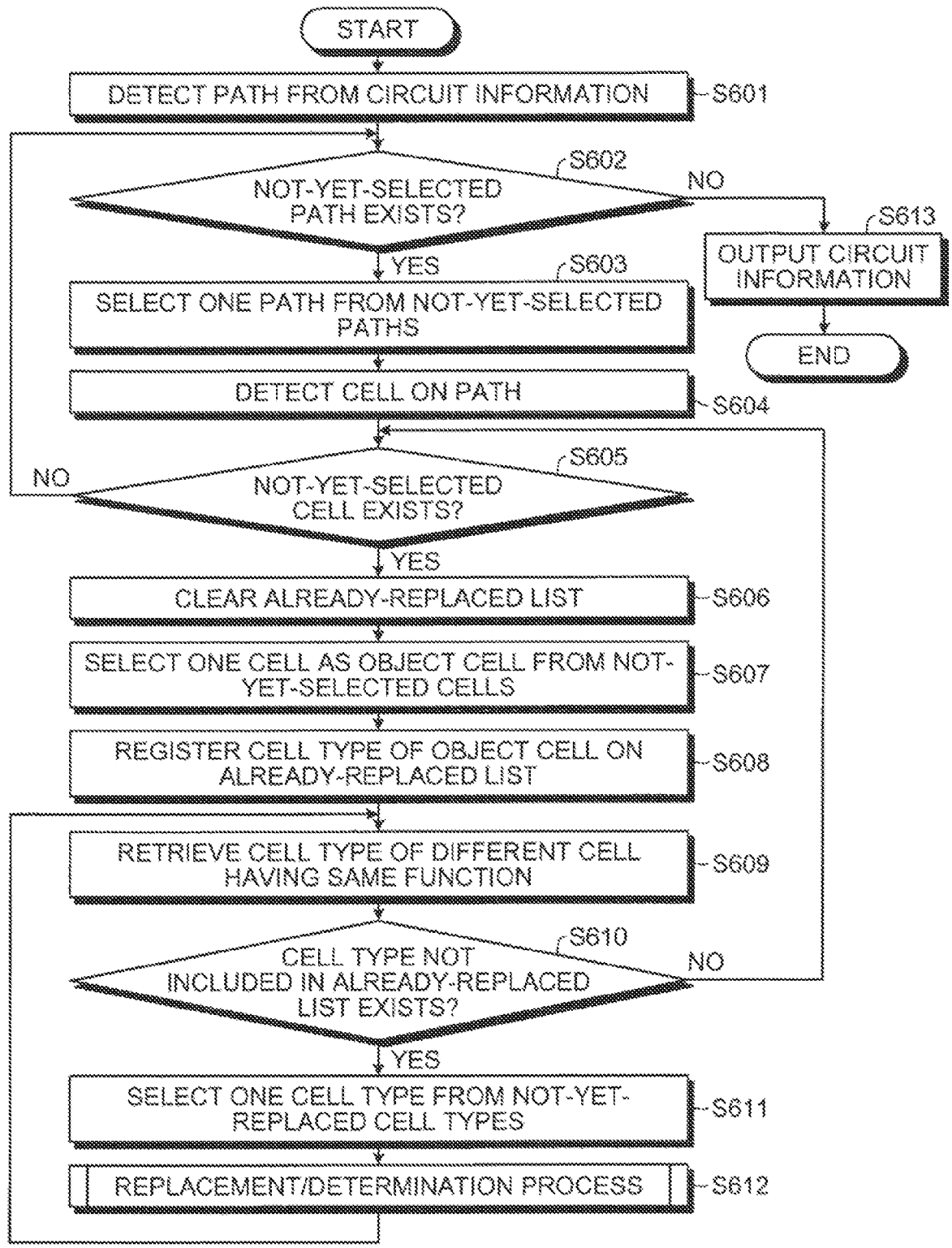
FIG. 6 is a flowchart of a design support process procedure of a design support apparatus 500 according to the first embodiment.

FIG. 6 is a flowchart of the design support process procedure of the design support apparatus 500 according to the first embodiment. In FIG. 6, first, the detecting unit 502 detects paths from circuit information (step S601). The paths represent a data path and a clock path corresponding to the data path making up a partial circuit, which are the data path 202 and the clock path 201 in the case of circuit-under-design 200.

After step S601, it is determined whether any not-yet-selected path exists (step S602). If it is determined that not-yet-selected paths exist (step 602: YES), one path is selected from the not-yet-selected paths (step S603) to detect a cell on the path (step S604). It is determined whether any not-yet-selected cell exists (step S605).

If it is determined that not-yet-selected cells exist (step S605: YES), the already-replaced list is cleared (step S606) and the selecting unit 503 selects one cell as the object cell from the not-yet-selected cells (step S607). The cell type of the object cell is registered on the already-replaced list (step S608), and cell types of different cells having an substantially identical function are retrieved (step S609) to determine whether any cell type not included in the already-replaced list is present (step S610).

If it is determined that cell types not included in the already-replaced list are present (step S610: YES), one cell type is selected from the non-replaced cell types (step S611). A replacement/determination process is subsequently executed (step S612) and the procedure returns to step S609.

On the other hand, if it is determined that no cell type not included in the already-replaced list is present (step S610: NO), the procedure returns to step S605.

If it is determined that no not-yet-selected cell is present at step S605 (step S605: NO), the procedure returns to step S602. If it is determined that there is no not-yet-selected path at step S602 (step S602: NO), the circuit information is output (step S613) to terminate a series of the processes.

Figure 7:
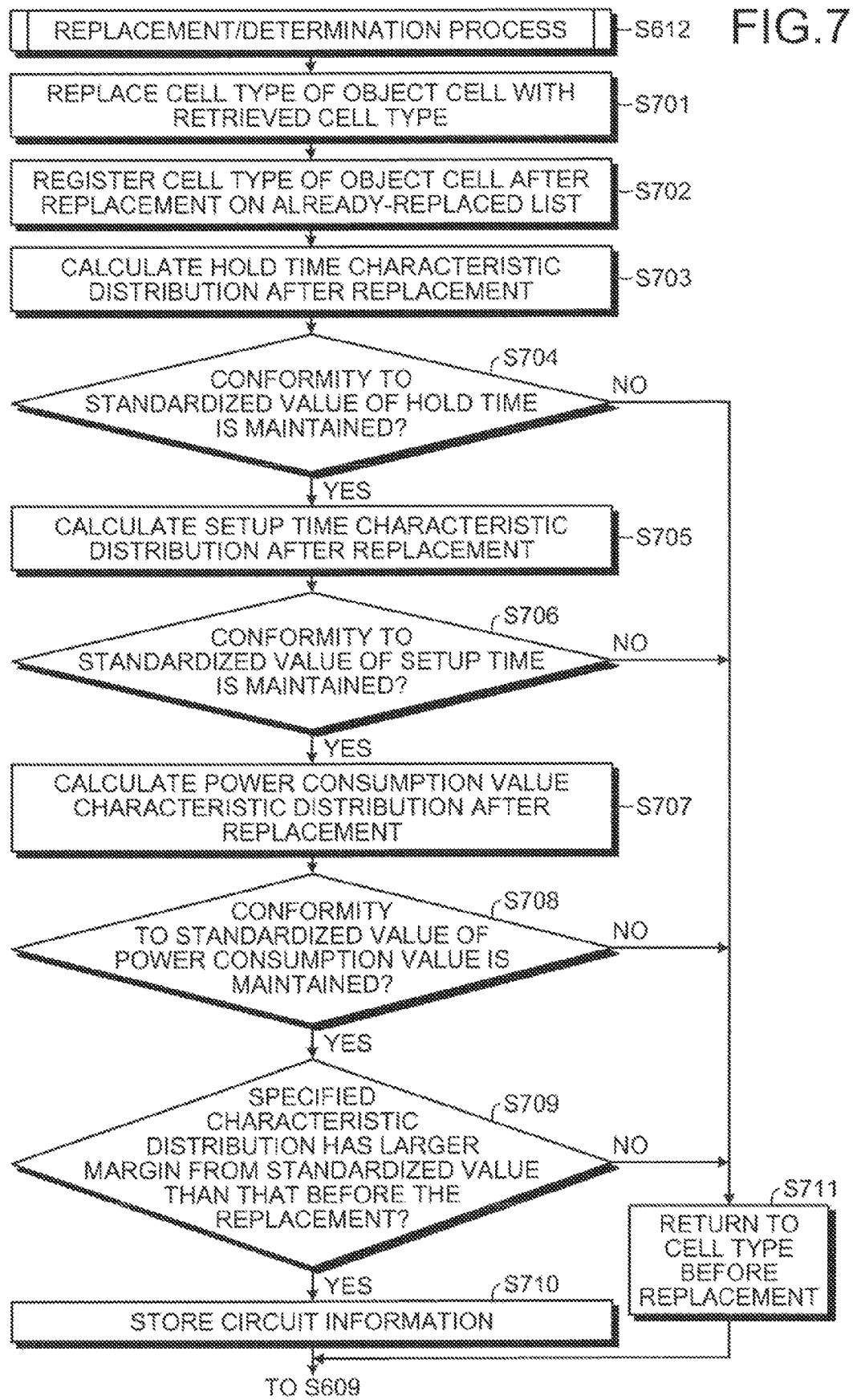
FIG. 7 is a flowchart of a detailed procedure of a replacement/determination process (step S612) depicted in FIG. 6.

FIG. 7 is a flowchart of detailed procedure of the replacement/determination process (step S612) depicted in FIG. 6. The cell type of the object cell is replaced with the retrieved cell type (step S701) and the cell type of the object cell after the replacement is registered on the already-replaced list (step S702). The calculating unit 506 calculates the hold time characteristic distribution after the replacement (step S703) and the determining unit 507 determines whether the conformity to the standardized value of the hold time is maintained (step 704). If the conformity to the standardized value of the hold time is maintained (step 704: YES), the calculating unit 506 calculates the setup time characteristic distribution after the replacement (step S705) and the determining unit 507 determines whether the conformity to the standardized value of the setup time is maintained (step 706).

If it is determined that the conformity to the standardized value of the setup time is maintained (step 706: YES), the calculating unit 506 calculates the power consumption value characteristic distribution after the replacement (step S707) and the determining unit 507 determines whether the conformity to the standardized value of the power consumption value is maintained (step 708). If it is determined that the conformity to the standardized value of the power consumption value is maintained (step 708: YES), the determining unit 507 determines whether the specified characteristic distribution has a larger margin from the standardized value than that before the replacement (step S709). If it is determined that the specified characteristic distribution has a larger margin from the standardized value than that before the replacement (step S709: YES), the circuit information after the replacement is stored (step S710) and the procedure returns to step S609.

On the other hand, if the conformity to the standardized value is not maintained (step S704: NO, step S706: NO, and step S708: NO), the cell type is returned to that before the replacement (step S711) and the procedure returns to step S609. If it is determined that the margin from the standardized value is smaller than that before the replacement (step S709: NO), the procedure goes to step S711.

In the second embodiment, the cells are initially set based on σ of the characteristic distribution of the delay value, and the cell type of the object cell is replaced based on σ of the characteristic distribution of the delay value. This enables characteristic information in violation of the restriction to be identified by the replacement of the cells from multiple types of characteristic information of a circuit-under-design irrespective of correlation between the different types.

Therefore, a type of characteristics in violation may be detected from multiple types of characteristic information and the respective characteristics may be improved. By performing the replacement based on σ of the delay values of the cells, the timing characteristics may be optimized such that fluctuations do not occur in the timing characteristics among semiconductor integrated circuits after fabrication.

The constituent elements substantially identical to those described in the first embodiment will be denoted by the similar reference numerals and the explanation thereof will not be repeated. In the second embodiment, the equations for calculating multiple types of characteristic distributions and the standardized values of the respective characteristics will be described by using the equations and the values substantially identical to the equations and the values described in the first embodiment.

The setting unit 501 has a function of setting each cell in the circuit information of the circuit-under-design to a cell having the smallest σ of the characteristic distribution of the delay value among a plurality of cells having different characteristics. For example, for example, the CPU 401 sequentially selects the cells on the data path 202 and the clock path 201 corresponding to the data path 202 making up the circuit-under-design 200 to retrieve the cell type having a function substantially identical to the cell selected from the table 300 and having the smallest σ of the characteristic distribution of the delay value. The cell type of the selected cell is set to the retrieved cell type. The setting result is stored in the storage device such as the RAM 403, the magnetic disk 405, and the optical disk 407.

The setting result is described with "cell names: cell types" as follows:
Cell1: BUF1,
Cell2: BUF1,
Cell3: BUF1,
Cell4: BUF1,
Cell5: BUF1.

As a result, the cell type of the cell may be set such that σ of the delay value becomes as small as possible and the fluctuations may be reduce if not prevented from occurring in the timing characteristics.

The calculating unit 506 has a function of calculating the characteristic distributions of the setup and hold timing slacks based on the characteristic distribution of the delay value of the cell set by the setting unit 501 and calculating the power consumption value characteristic distribution based on the power consumption value characteristic distributions of the cells. The function of the calculating unit 506 calculating the characteristic distributions is a function substantially identical to that described in the first embodiment and therefore will not be described in detail.

The hold timing slack characteristic distribution calculated by using above Equation 4 will be described as X1 below. An example of substituting the equations for the delay values of the cells into X1 is as follows:

$$X1=100+0.2\times(50+2\times a1+1\times a2)+0.3\times(50+2\times a1+1\times a2)+0.4\times(50+2\times a1+1\times a2)+0.5\times(50+2\times a1+1\times a2)+0.6\times(50+2\times a1+1\times a2).$$

The calculation result of X1 is as follows:

$$X1=200+4\times a1+2\times a2.$$

The setup timing slack characteristic distribution calculated by using Equation 6 will be described as Y1 below. An example of substituting the equations for the delay values of the cells into Y1 is as follows:

$$Y1=150+0.2\times(50+2\times a1+1\times a2)+0.4\times(50+2\times a1+1\times a2)+0.6\times(50+2\times a1+1\times a2)+0.8\times(50+2\times a1+1\times a2)+1.0\times(50+2\times a1+1\times a2)+1.0\times(50+2\times a1+1\times a2).$$

The calculation result of Y1 is as follows:

$$Y1=300+6\times a1+3\times a2.$$

The power consumption calculated by using above Equation 8 will be described as Z1 below. An example of substituting the equations for the delay values of the cells into Z1 is as follows:

$$Z1=300+0.3\times(50+2\times b1+1\times b2)+0.4\times(50+2\times b1+1\times b2)+0.5\times(50+2\times b1+1\times b2)+0.6\times(50+2\times b1+1\times b2)+0.7\times(50+2\times b1+1\times b2).$$

The calculation result of Z1 is as follows:

$$Z1=675+2.5\times b1+5\times b2.$$

Equations 4, 6, and 8 are equations for expressing normal distributions as explained above. In the second embodiment, it is judged whether all the values of "μ±3σ" of the characteristic distribution satisfy the standardized value as is the case with the first embodiment.

The determining unit 507 has a function of determining whether multiple types of the characteristic distributions calculated by the calculating unit 506 conforms to the standardized values of the respective characteristics. The determining unit 507 has a function substantially identical to the function described in the first embodiment and therefore the explanation thereof will not be described in detail. First, for the hold timing slack characteristic distribution, the fastest value is compared with a standardized value. Therefore, if "μ−3σ" of the hold timing slack characteristic distribution is at least equal to the standardized value of the hold timing, the hold timing slack characteristic distribution conforms to the standardized value.

Therefore, −3 is substituted for each of a1 and a2 of X1 above. The calculation result of X1 is as follows:

$$X1=182.$$

Since X1 is at most equal to Dhd_st, it is determined that the hold timing slack characteristic distribution is in violation of the standardized value of the hold timing.

The setup timing slack characteristic distribution is compared with the standardized value in terms of the fastest value. Therefore, if "μ−3σ" of the setup timing slack characteristic distribution is at least equal to the standardized value of the setup timing, the setup timing slack characteristic distribution conforms to the standardized value.

Therefore, −3 is substituted into each of a1 and a2 of Y1 above. The calculation result of Y1 is as follows:

$$Y=273.$$

Since Y1 is at least equal to Dsu_st, it is determined that the setup timing slack characteristic distribution conforms to the standardized value of the setup timing.

Lastly, the power consumption value characteristic distribution is compared with the standardized value in terms of the maximum value. Therefore, if "μ+3σ" of the power consumption value characteristic distribution is at most equal to the standardized value of the power consumption value, the power consumption value characteristic distribution conforms to the standardized value.

Therefore, +3 is substituted into each b1 and b2 of Z1 above. The calculation result of Z1 is as follows:

$$Z1=697.5.$$

Since Z1 is at most equal to P_st, it is determined that the power consumption value characteristic distribution conforms to the standardized value of the power consumption value.

The detecting unit 502 has a function of detecting the path determined by the determining unit 507 as having the hold timing slack characteristic distribution in violation of the standardized value of the hold timing from the circuit information of the circuit-under-design. For example, for example, the CPU 401 detects the path determined as being in violation of the standardized value of the hold timing based on the determination result. Since the determining unit 507 determines that the hold timing slack characteristic distribution is in violation of the standardized value of the hold timing as above, the detecting unit 502 detects the clock path 201 and the data path 202.

The detecting unit 502 has a function of detecting the path determined by the determining unit 507 as having the setup timing slack characteristic distribution in violation of the standardized value of the setup timing from the circuit information of the circuit-under-design.

For example, the CPU 401 detects the path determined as being in violation of the standardized value of the setup timing based on the determination result. The paths in the circuit-under-design 200 are reduce if not prevent the clock path 201 and the data path 202 in this embodiment. Since the determining unit 507 determines that the setup timing slack characteristic distribution conforms to the standardized value of the setup timing as above, the detecting unit 502 detects no path.

The detecting unit 502 has a function of detecting, from the circuit-under-design, the data path and the clock path corresponding to the data path making up the partial circuit determined by the determining unit 507 as having the power consumption value characteristic distribution in violation of the standardized value of the power consumption value. The detecting unit 502 may detect the path in violation of the standardized value of the power consumption value if it is determined that no path is in violation of the standardized value of the power consumption value.

For example, the CPU 401 reads the determination result from the storage device to detect the data path and the clock path corresponding to the data path making up the partial circuit determined as being in violation of the standardized value of the power consumption value. The determining unit 507 determines that the power consumption value characteristic distribution conforms to the standardized value of the power consumption value as above. Therefore, in the second embodiment, the detecting unit 502 detects no data path and no clock path making up the partial circuit determined as being in violation of the standardized value of the power consumption value.

The selecting unit 503 has a function of selecting a cell having the largest median value of the characteristic distribution of the delay value as the object cell from the cells on the clock path detected by the detecting unit 502. The selecting unit 503 also has a function of selecting a cell having the smallest median value of the characteristic distribution of the delay value as the object cell from the cells on the detected data path.

For example, the CPU 401 extracts all the cells from the data path 202. Based on the cell types of the cells, $\mu$ of the delay value 302 is read from the table 300 for each of the cells. The cell having the largest $\mu$ of the delay value 302 is selected as an object cell candidate 1. Both Cell1 and Cell2 are set to BUF1 in the data path 202 as above. Therefore, an arbitrary cell is selected as the object cell candidate 1 from Cell1 and Cell2. It is assumed herein that Cell1 is selected as the object cell candidate 1.

For example, the CPU 401 extracts all the cells from the clock path 201. Based on the cell types, $\mu$ is read from the table 300 for each of the cells. The cell having the largest $\mu$ is selected as an object cell candidate 2. Cell3 to Cell5 are all set to BUF1 in the clock path 201 as above. Therefore, an arbitrary cell is selected as the object cell candidate 2 from Cell3 to Cell5. It is assumed herein that Cell4 is selected as the object cell candidate 2.

Cell1 is selected as the object cell candidate 1 and Cell4 is selected as the object cell candidate 2. Therefore, one of the cells is selected as the object cell. For example, the average value is calculated for $\mu$ of the delay distributions of all the cells in the circuit-under-design 200, and the object cell is selected that has a larger absolute value among the differences between the calculated average value and $\mu$ of the delay value of the object cell candidate. However, if the absolute values of the difference are equal, the cell on the data path is selected as the object cell. Since each of Cell1 to Cell4 is BUF1, the absolute values of the difference between the calculated average value and the object cell candidate are equal. Therefore, Cell1 is selected, which is the cell on the data path 202.

Therefore, the cell having the largest impact on the hold timing slack may automatically be selected from the clock path and the data path. Therefore, the characteristics of the hold timing slack may be improved and at the similar time the improvement of the partial circuit may be achieved by making the setup timing slack and the power consumption value conform to the restrictions.

The replacing unit 504 has a function of replacing the object cell selected by the selecting unit 503 with a cell having the smallest standard deviation of the characteristic deviation of the delay value among the cells having the function substantially identical to and the characteristics different from the object cell. For example, for example, the CPU 401 retrieves the cell type having the smallest $\sigma$ of the delay value among the cell types from the table 300 except the cell type of the object cell. Therefore, BUF4 is retrieved from the table 300. For example, the CPU 401 replaces the cell type of the object cell with the retrieved cell type. The replacement result is stored in the storage device such as the RAM 403, the magnetic disk 405, and the optical disk 407.

The setting result is described with "cell names: cell types" as follows:
Cell1: BUF4,
Cell2: BUF1,
Cell3: BUF1,
Cell4: BUF1,
Cell5: BUF1.

The calculating unit 506 calculates multiple types of characteristic distributions again and the determining unit 507 determines whether multiple types of the calculated characteristic distributions conforms to the standardized values of the respective characteristics.

The calculation is performed by substituting the equations of the respective cells into Equations 4, 6, and 8 as above. It is assumed that X2 denotes the equation for the hold timing slack calculated by Equation 4; Y2 denotes the equation for the setup timing slack calculated by Equation 6; and Z2 denotes the equation for the power consumption value calculated by Equation 8. The calculation result is as follows.

$$X2=212+4.4 \times a1+2.2 \times a2,$$

$$Y2=312+6.4 \times a1+3.2 \times a2,$$

$$Z2=657+2.5 \times b1+5 \times b2.$$

X2 and Y2 at "$\mu-3\sigma$", i.e., the fastest values of the characteristic distributions and Z2 at "$\mu+3\sigma$", i.e., the largest value of the characteristic distribution are as follows:

$$X2=191.6,$$

$$Y2=283.2,$$

$$Z2=679.5.$$

X2, Y2, and Z2 are determined by the determining unit 507 as conforming to the respective standardized values. Therefore, multiple types of the characteristic distributions related to the circuit-under-design 200 may all be made conform to the respective values by replacing the cell type of Cell1.

The output unit 510 has a function substantially identical to that in the first embodiment and therefore the explanation thereof will be omitted.

The deleting unit 508 has a function of deleting the object cell if the object cell is a cell on the clock path acting as a buffer and if the determining unit 507 determines that the hold timing is violated.

For example, the CPU 401 determines whether the object cell is a cell on the clock path acting as a buffer. If it is determined that the object cell is a buffer on the clock path, the object cell is deleted from the circuit-under-design 200 to connect the wiring coupled to the input of the object cell with the wiring coupled to the output. The deletion result is stored in the storage device such as the RAM 403, the magnetic disk 405, and the optical disk 407.

After the deleting unit 508 deletes the object cell, the calculating unit 506 calculates multiple types of characteristic information again and the determining unit 507 determines whether multiple types of the characteristic information is in violation of the respective standardized values.

When the determining unit 507 determines that the hold timing is violated, the inserting unit 509 has a function of newly inserting a buffer onto the data path if the object cell is a cell on the data path.

For example, the CPU 401 determines whether the object cell is a cell on the data path. If the object cell is a cell on the data path, a buffer is newly inserted to connect the input of the inserted buffer with the output of the object cell. The output of the inserted buffer is coupled with the input of the cell that is the output destination of the object cell. For example, the inserted buffer has the cell type having the smallest $\mu$ of the delay value among multiple cell types. The insertion result is stored in the storage device such as the RAM 403, the magnetic disk 405, and the optical disk 407.

After the inserting unit 509 inserts a buffer, the calculating unit 506 and the determining unit 507 again calculate multiple types of characteristic information and determine whether multiple types of the characteristic information is in violation of the respective standardized values.

The second embodiment has been described in terms of the case of the violation with the restriction of the hold timing. The selection of the object cell by the selecting unit 503 will then be described, for example, when the detecting unit 502 detects the data path and the clock path in violation of the restriction of the setup timing.

If the data path and the clock path making up the partial circuit in violation of the restriction of the setup timing are detected, the selecting unit 503 has a function of selecting a cell having the smallest median value of the characteristic distribution of the timing of the cell as the object cell from the cells on the clock path. The selecting unit 503 also has a function of selecting a cell having the largest median value of the characteristic distribution of the timing of the cell as the object cell from the cells on the data path.

For example, the CPU 401 extracts all the cells on the data path 202. Based on the cell types, $\mu$ is read from the table 300 for each of the cells. The cell having the smallest $\mu$ is selected among the extracted cells as an object cell candidate 1.

For example, the CPU 401 extracts all the cells on the clock path 201. Based on the cell types, $\mu$ is read from the table 300 for each of the cells. The cell having the largest $\mu$ is selected among the extracted cells as an object cell candidate 2.

Either the object cell candidate 1 or the object cell candidate 2 is selected as the object cell. For example, the median value is calculated for $\mu$ of the delay distributions of all the cells in the circuit-under-design 200, and the object cell is selected as the cell having a larger absolute value of the difference between the calculated median value and $\mu$ of the delay value of the object cell candidate. However, if the absolute values of the difference are equal between the object cell candidate 1 and the object cell candidate 2, the cell on the data path, i.e., the first object candidate cell is selected as the object cell. The selection result is stored in the storage device such as the RAM 403, the magnetic disk 405, and the optical disk 407. The functions of the replacing unit 504, the determining unit 507, and the output unit 510 are substantially identical to those in the example of the hold timing and therefore the explanation thereof will be omitted.

Therefore, the cell having the largest impact on the setup timing slack may automatically be selected from the clock path and the data path. Therefore, the characteristics of the setup timing slack may be improved and at the similar time, the improvement of the partial circuit may be achieved by making the hold timing slack and the power consumption value conform to the restrictions.

When the determining unit 507 determines that the setup timing is violated, the deleting unit 508 deletes the object cell if the object cell is a buffer on the data path.

For example, the CPU 401 determines whether the object cell is a buffer on the data path. If it is determined that the object cell is a buffer on the clock path, the object cell is deleted from the circuit-under-design 200 to connect the wiring coupled to the input of the object cell with the wiring coupled to the output. The deletion result is stored in the storage device such as the RAM 403, the magnetic disk 405, and the optical disk 407.

If the determining unit 507 determines that the setup timing is violated, the inserting unit 509 has a function of newly inserting a buffer onto the clock path if the object cell is a cell on the clock path.

For example, the CPU 401 determines whether the object cell is a cell on the clock path. If the object cell is a cell on the clock path, a buffer is newly inserted to connect the input of the buffer with the output of the object cell. The output of the inserted buffer is coupled with the input of the cell that is the output destination of the object cell. The insertion result is stored in the storage device such as the RAM 403, the magnetic disk 405, and the optical disk 407.

If a path in violation of the restriction of the power consumption is detected, the selecting unit 503 selects an arbitrary cell on the path. Therefore, the selecting unit 503 may select the object cell as in the case when the path in violation of the restriction of the setup timing is detected or may select the object cell as in the case when the path in violation of the restriction of the hold timing is detected. The selection result is stored in the storage device such as the RAM 403, the magnetic disk 405, and the optical disk 407. The functions of the replacing unit 504, the determining unit 507, the deleting unit 508, and the output unit 510 are substantially identical to those in the example of the setup timing and therefore the explanation thereof will be omitted.

In the second embodiment, the cell type of the object cell selected within the circuit-under-design is replaced based on $\sigma$ of the characteristic distribution of the delay value. This enables characteristic information in violation of the restriction to be identified by the replacement of the cells from multiple types of characteristic information of the circuit-under-design irrespective of correlation between the different types.

Therefore, a type of characteristics in violation may be detected from multiple types of characteristic information and the respective characteristics may be improved. By performing the replacement based on $\sigma$ of the delay values of the cells, the occurrence of variations may be reduced in the characteristics of the hold timing slack and the setup timing slack while the power consumption value characteristic distribution may be made conform to the standardized value. Therefore, the partial circuit may be optimized such that the variations are reduced in the timing characteristics to achieve the improvement of the partial circuit.

Figure 8:
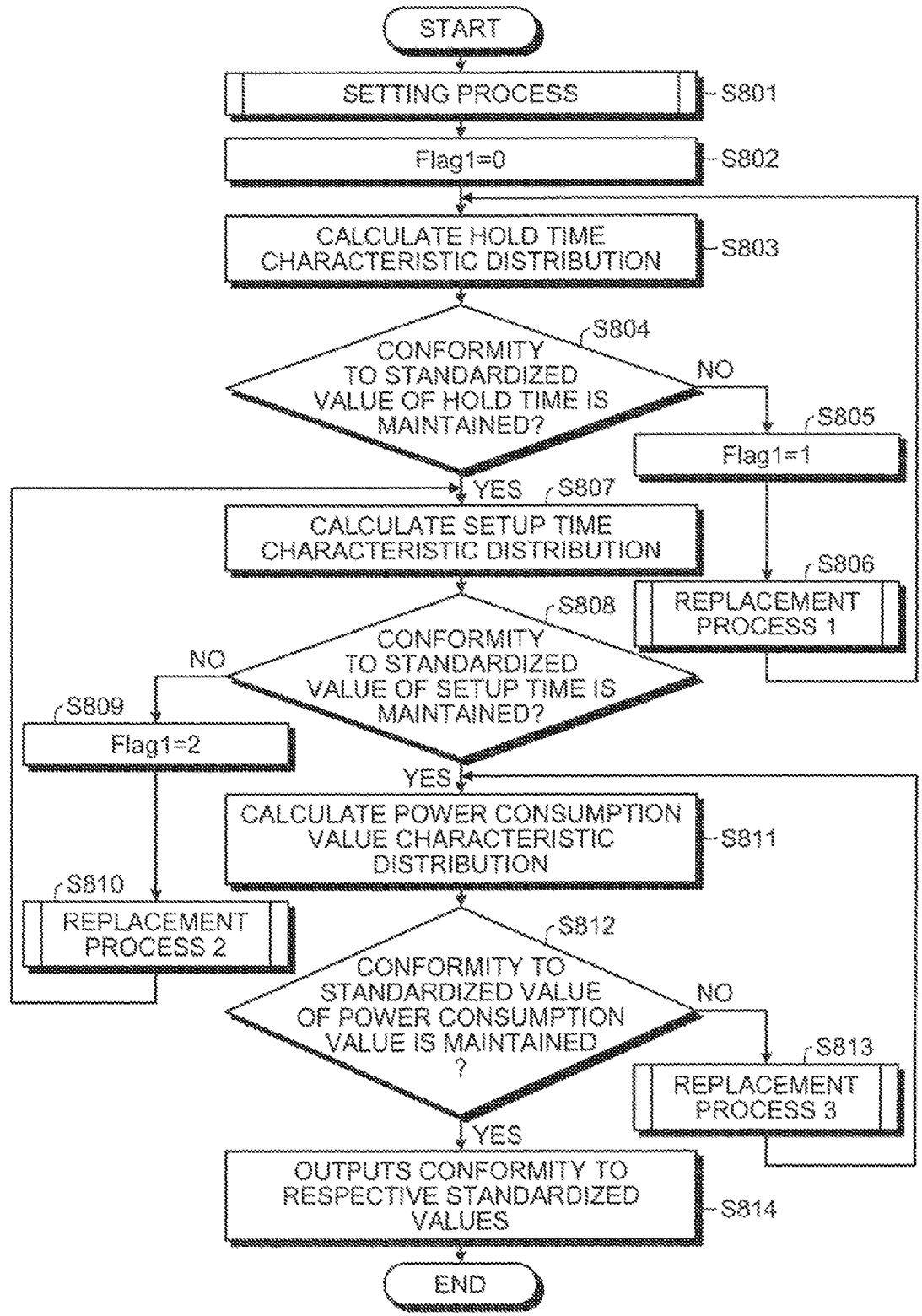
FIG. 8 is a flowchart of the design support process procedure of the design support apparatus 500 according to the second embodiment.

FIG. 8 is a flowchart of the design support process procedure of the design support apparatus 500 according to the second embodiment. The design support process procedure described herein is terminated when it is determined that the setup timing characteristic distribution, the hold timing characteristic distribution, and the power consumption characteristic distribution conform to the respective standardized values. The path to be processed is an arbitrary path.

First, the setting unit 501 executes the setting process (step S801) to set Flag1=0 (step S802). Flag1 is a flag indicative of whether a partial circuit is in violation of the restriction of the hold timing or in violation of the restriction of the setup timing. The calculating unit 506 calculates the hold time characteristic distribution (step S803) and the determining unit 507 determines whether the conformity to the standardized value of the hold time is maintained (step S804).

If it is determined that the conformity to the standardized value of the hold time is not maintained (step S804: NO), Flag1=1 is set (step S805) to execute a replacement process 1 (step S806) and the procedure returns to step S803.

On the other hand, if it is determined that the conformity to the standardized value of the hold time is maintained (step S804: YES), the setup time characteristic distribution is calculated (step S807) and the determining unit 507 determines whether the conformity to the standardized value of the setup time is maintained (step S808).

If it is determined that the conformity to the standardized value of the setup time is not maintained (step S808: NO), Flag1=2 is set (step S809) to execute a replacement process 2 (step S810) and the procedure returns to step S807.

On the other hand, if it is determined that the conformity to the standardized value of the setup time is maintained (step S808: YES), the power consumption value characteristic distribution is calculated (step S811) to determine whether the conformity to the standardized value of the power consumption value is maintained (step S812).

If it is determined that the conformity to the standardized value of the power consumption value is not maintained (step S812: NO), a replacement process 3 is executed (step S813) and the procedure returns to step S811.

On the other hand, if it is determined that the conformity to the standardized value of the power consumption value is maintained (step 812: YES), the output unit 510 outputs the conformity to the respective standardized values (step S814) and a series of the processes is terminated.

Figure 9:
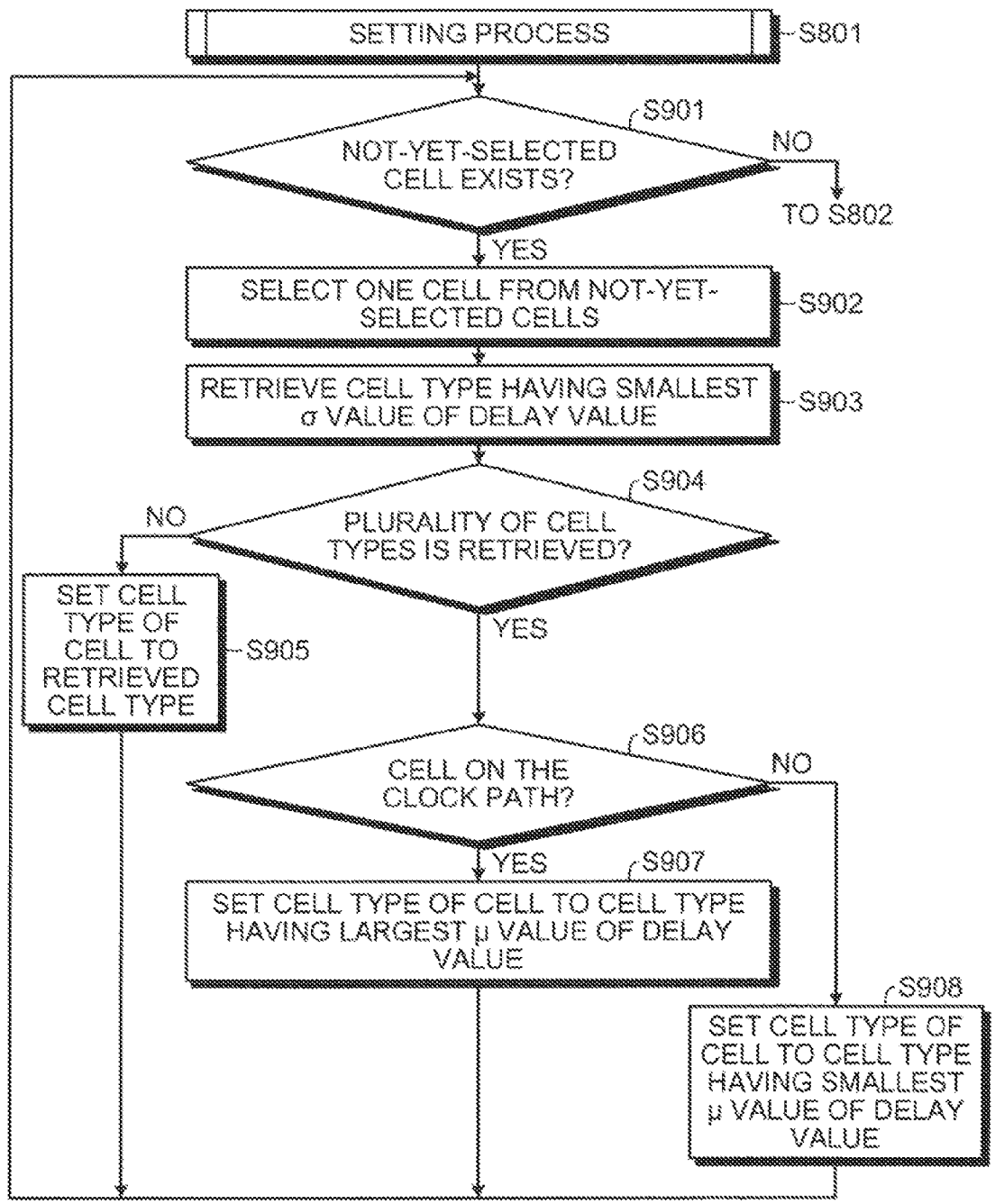
FIG. 9 is a flowchart of the detailed process procedure of a setting process (step S801) depicted in FIG. 8.

FIG. 9 is a flowchart of the detailed process procedure of the setting process (step S801) depicted in FIG. 8. First, it is determined whether any not-yet-selected cell exists among the cells on the data path and the clock path corresponding to the data path making up the partial circuit (step S901). If it is determined that not-yet-selected cells exist (step S901: YES), one cell is selected from the not-yet-selected cells (step S902). A cell type having the smallest σ of the characteristic distribution of the delay value is retrieved from cells having different characteristics (step S903), and it is determined whether multiple cell types are retrieved (step S904).

If it is determined that multiple cell types are not retrieved (step S904: NO), the replacing unit 504 sets the cell type of the selected cell to the retrieved cell type (step S905) and the procedure returns to step S901. As a result, the cells on the data path and the clock path corresponding to the data path making up the partial circuit may automatically be set to the cell type with less fluctuation of the delay value to reduce if not prevent the fluctuations from occurring in the timing characteristics.

On the other hand, if it is determined that multiple cell types are retrieved (step S904: YES), it is determined whether the selected cell is a cell on the clock path (step S906). In the case of the cell on the clock path (step S906: YES), the replacing unit 504 sets the cell type of the selected cell to the cell type having the largest μ of the delay value from the retrieved cells (step S907) and the procedure returns to step S901.

If the selected cell is not a cell on the clock path (step S906: NO), the replacing unit 504 sets the cell type of the selected cell to the cell type having the smallest μ of the delay value from the retrieved cells (step S908) and the procedure returns to step S901. On the other hand, if it is determined that no not-yet-selected cell is left (step S901: NO), the procedure goes to step S802.

Figure 10:
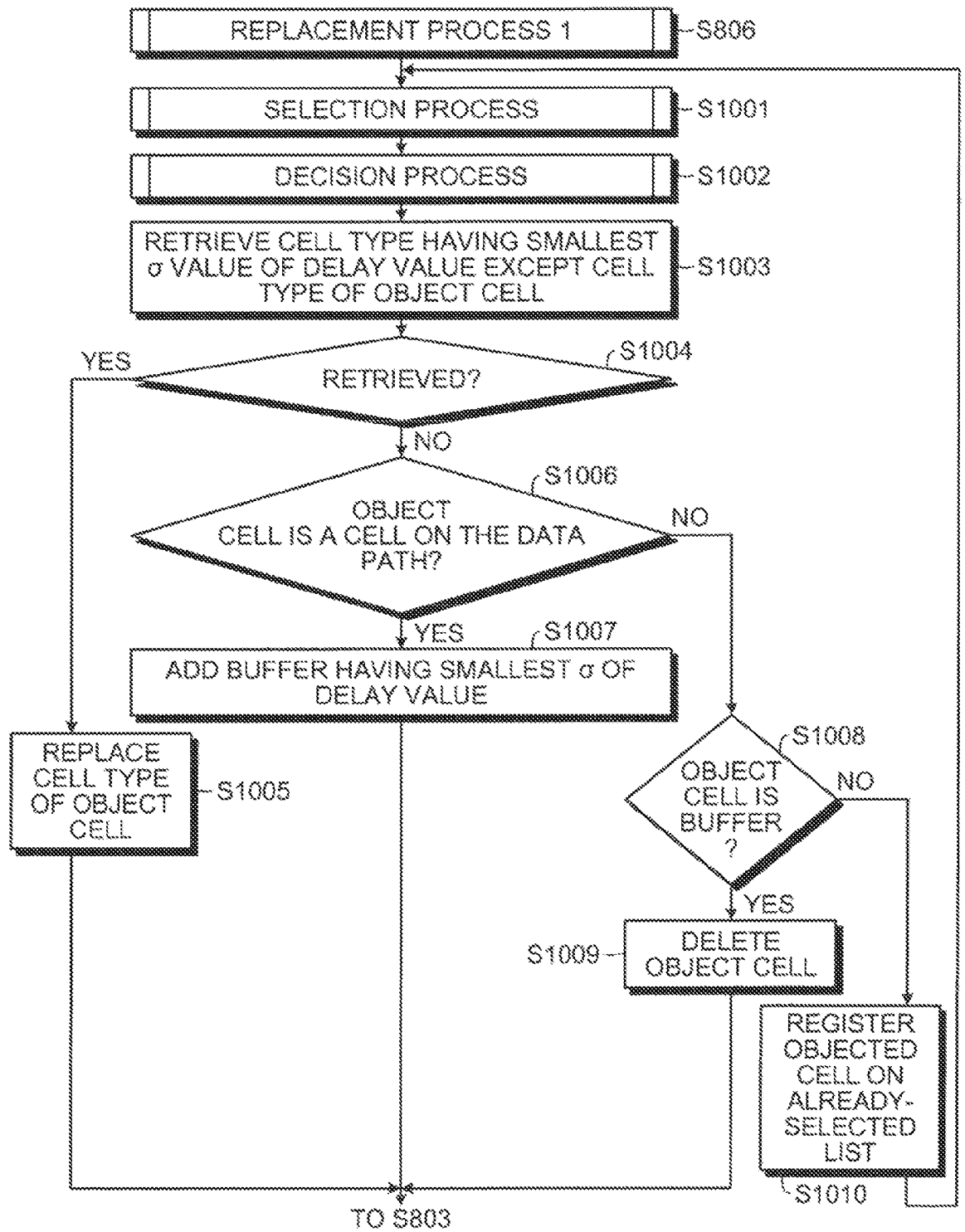
FIG. 10 is a flowchart of the detailed process procedure of a replacement process 1 (step S806) depicted in FIG. 8.

FIG. 10 is a flowchart of the detailed process procedure of the replacement process 1 (step S806) depicted in FIG. 8. A selection process is executed (step S1001) and a decision process is executed (step S1002). A cell type having the smallest σ of the delay value is retrieved except the cell type of the object cell (step S1003), and it is determined whether the cell type is retrieved (step S1004). If retrieved (step S1004: YES), the cell type of the object cell is replaced with the retrieved cell type (step S1005) and the procedure returns to step S803.

On the other hand, if not retrieved (step S1004: NO), it is determined whether the object cell is a cell on the data path (step S1006). If it is determined that the object cell is a cell on the data path (step S1006: YES), the inserting unit 509 adds a buffer having the smallest σ of the delay value (step S1007) and the procedure returns to step S803. This increases the delay amount of the data path and the violation of the hold timing may be reduce if not prevented.

On the other hand, if it is determined that the object cell is not a cell on the data path (step S1006: NO), it is determined whether the object cell is a buffer (step S1008). If it is determined that the object cell is a buffer (step S1008: YES), the deleting unit 508 deletes the object cell (step S1009) and the procedure returns to step S803. This reduces the delay amount of the clock path and the violation of the hold timing may be reduce if not prevented.

On the other hand, if it is determined that the object cell is not a buffer (step S1010: NO), the objected cell is registered on an already-selected list (step S1010) and the procedure returns to step S1001.

Figure 11:
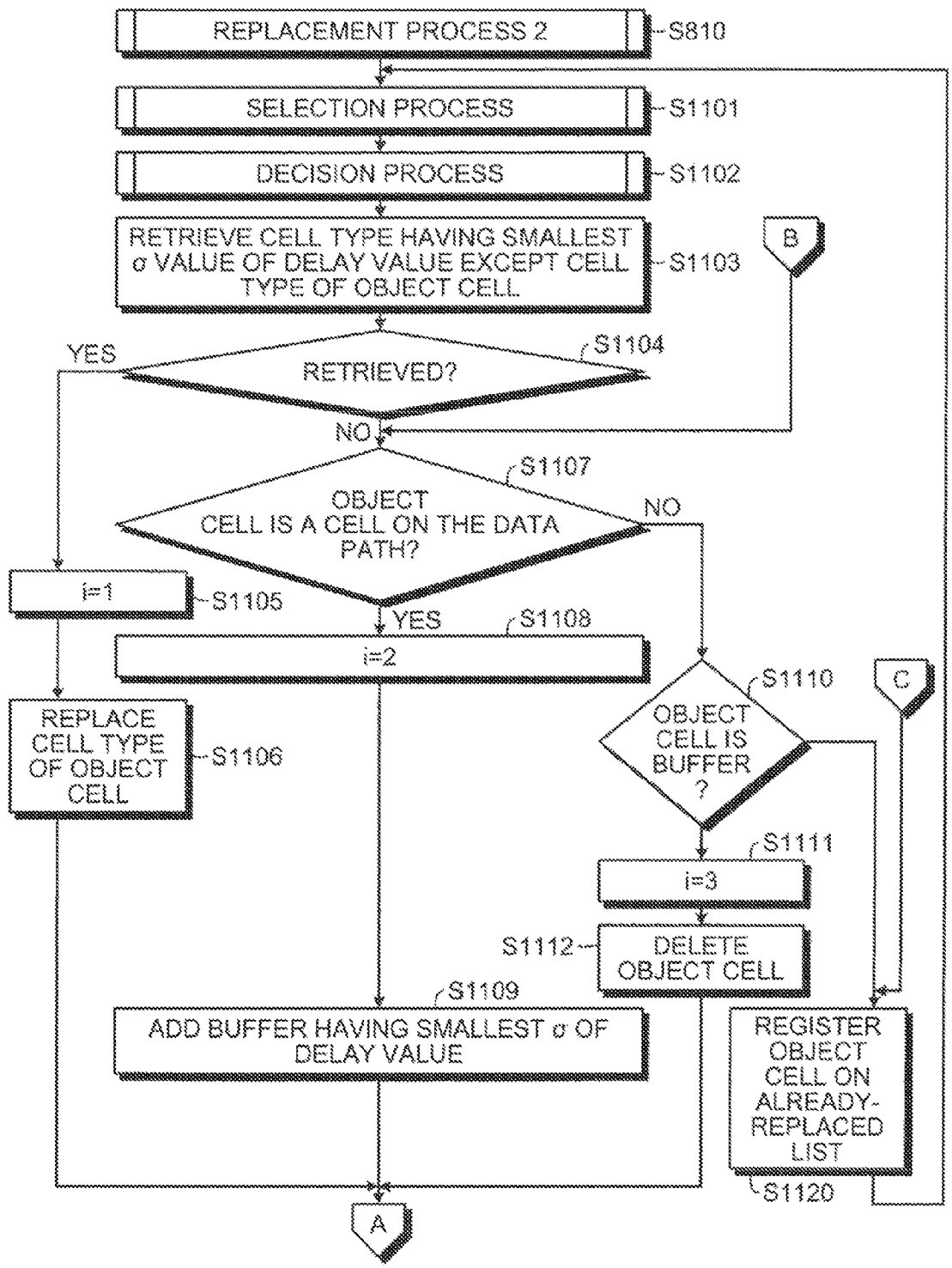
FIG. 11 is a flowchart of the detailed process procedure of a replacement process 2 (step S810) depicted in FIG. 8.
Figure 12:
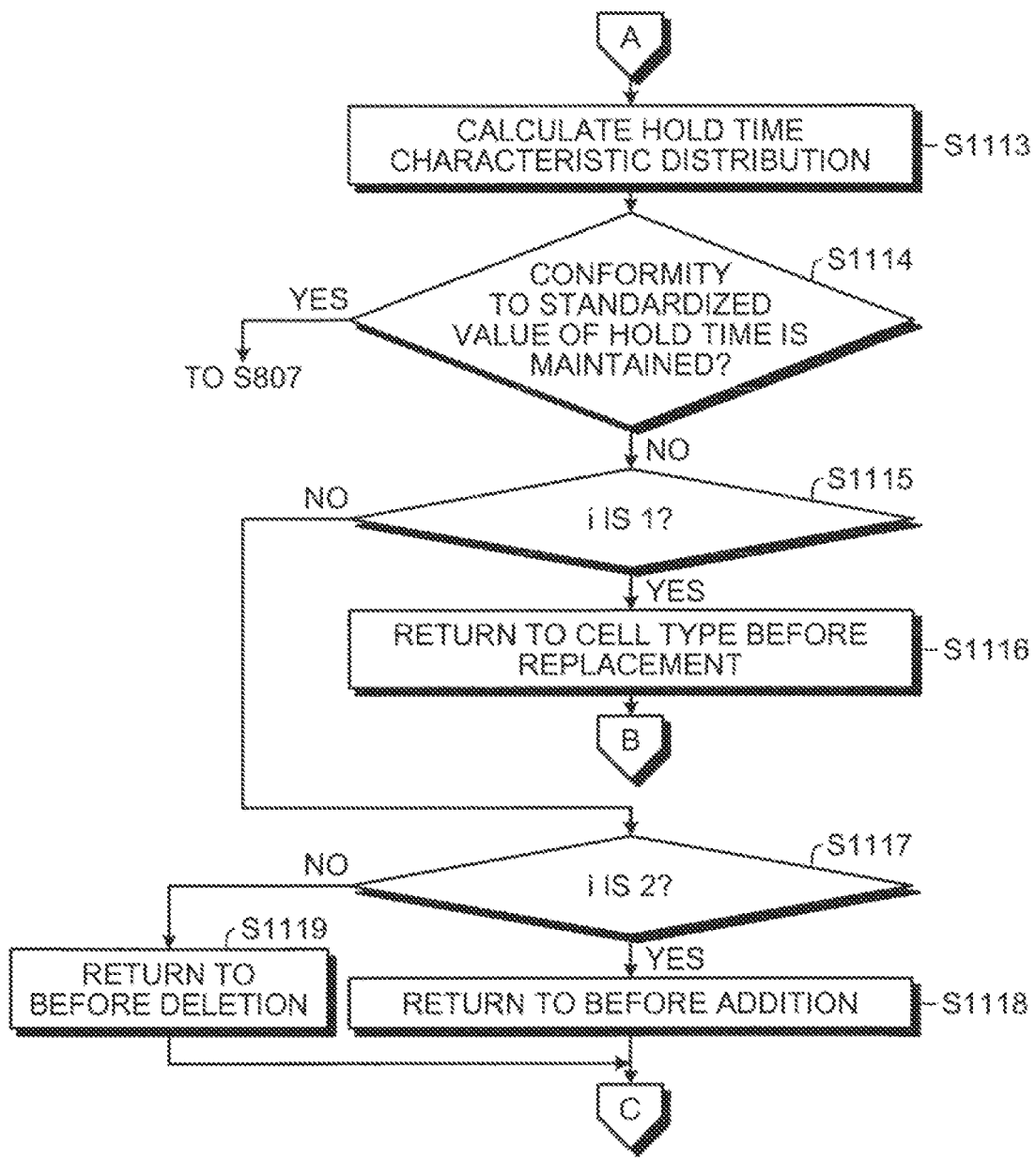
FIG. 12 is a flowchart of the detailed process procedure of the replacement process 2 (step S810) depicted in FIG. 8.

FIGS. 11 and 12 are flowcharts of the detailed process procedure of the replacement process 2 (step S810) depicted in FIG. 8. First, in FIG. 11, the selection process is executed (step S1101) and the decision process is executed (step S1102). A cell type having the smallest σ of the characteristic distribution of the delay value is retrieved except the cell type of the object cell (step S1103), and it is determined whether the cell type is retrieved (step S1104). If retrieved (step S1104: YES), i=1 is set (step S1105); the replacing unit 504 replaces the cell type of the object cell (step S1106); and the procedure goes to step S1113 (step of FIG. 12). In this case, "i" denotes that a cell type of a cell is replaced.

On the other hand, if not retrieved (step S1104: NO), it is determined whether the object cell is a cell on the clock path (step S1107). In the case of the cell on the clock path (step S1107: YES), i=2 is set (step S1108) and the inserting unit 509 adds a buffer having the smallest σ of the characteristic distribution of the delay value (step S1109) and the procedure goes to step S1113 (step of FIG. 12). This increases the delay of the clock path and the violation of the setup timing may be reduce if not prevented. In this case, "i" denotes that a buffer is added.

On the other hand, if the object cell is not a cell on the clock path (step S1107: NO), it is determined whether the object cell is a buffer (step S1110). If it is determined that the object cell is a buffer (step S1110: YES), i=3 is set (step S1111) and the deleting unit 508 deletes the object cell (step S1112) and the procedure goes to step S1113 (step of FIG. 12). This reduces the delay of the data path and the violation of the setup timing may be reduce if not prevented. In this case, "i" denotes that the object cell is deleted.

On the other hand, if it is determined that the object cell is not a buffer (step S1110: NO), the object cell is registered on the already-replaced list (step S1120) and the procedure returns to step S1101.

Referring to FIG. 12, subsequent to the step S1106, S1109, or S1112 described above, the calculating unit 506 calculates the hold time characteristic distribution (step S1113). It is then determined whether the conformity to the standardized value of the hold time is maintained (step 1114). If it is determined that the conformity to the standardized value of the hold time is maintained (step 1114: YES), the procedure goes to step S807.

On the other hand, if it is determined that the conformity to the standardized value of the hold time is not maintained (step 1114: NO), it is determined whether i is equal to 1 (step S1115). If i is equal to 1 (step S1115: YES), the cell type is returned to that before the replacement (step S1116) and the procedure returns to step S1107 (step of FIG. 11).

If i is not equal to 1 (step S1115: NO), it is determined whether i is equal to 2 (step S1117). If i is equal to 2 (step S1117: YES), the cell type is returned to that before the addition (step S1118) and the procedure goes to step S1120 (step of FIG. 11). On the other hand, if i is equal to 2 (step S1117: NO), the cell type is returned to that before the deletion (step S1119) and the procedure goes to step S1120 (step of FIG. 11).

Figure 13:
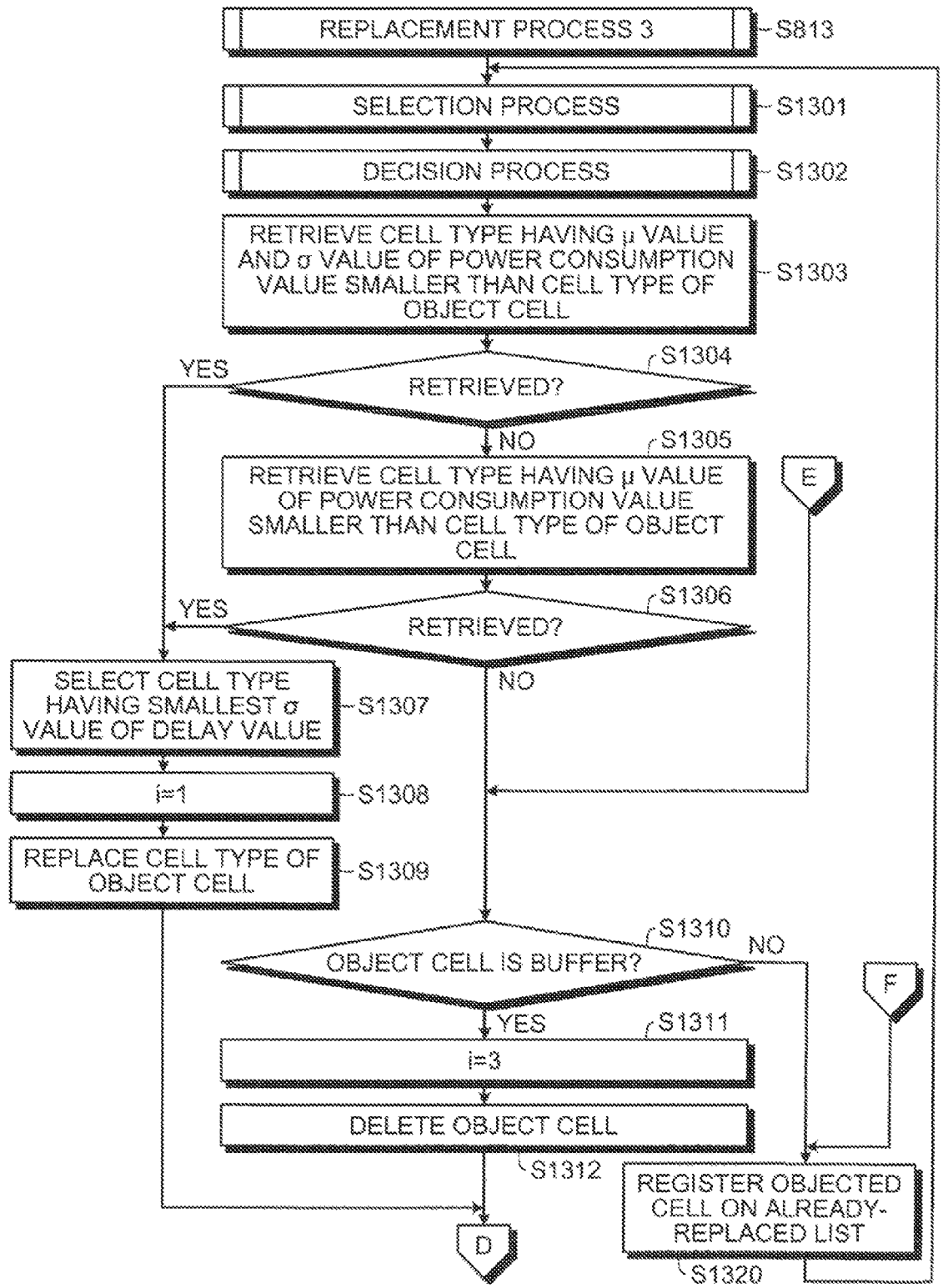
FIG. 13 is a flowchart of the detailed process procedure of a replacement process 3 (step S813) depicted in FIG. 8.
Figure 14:
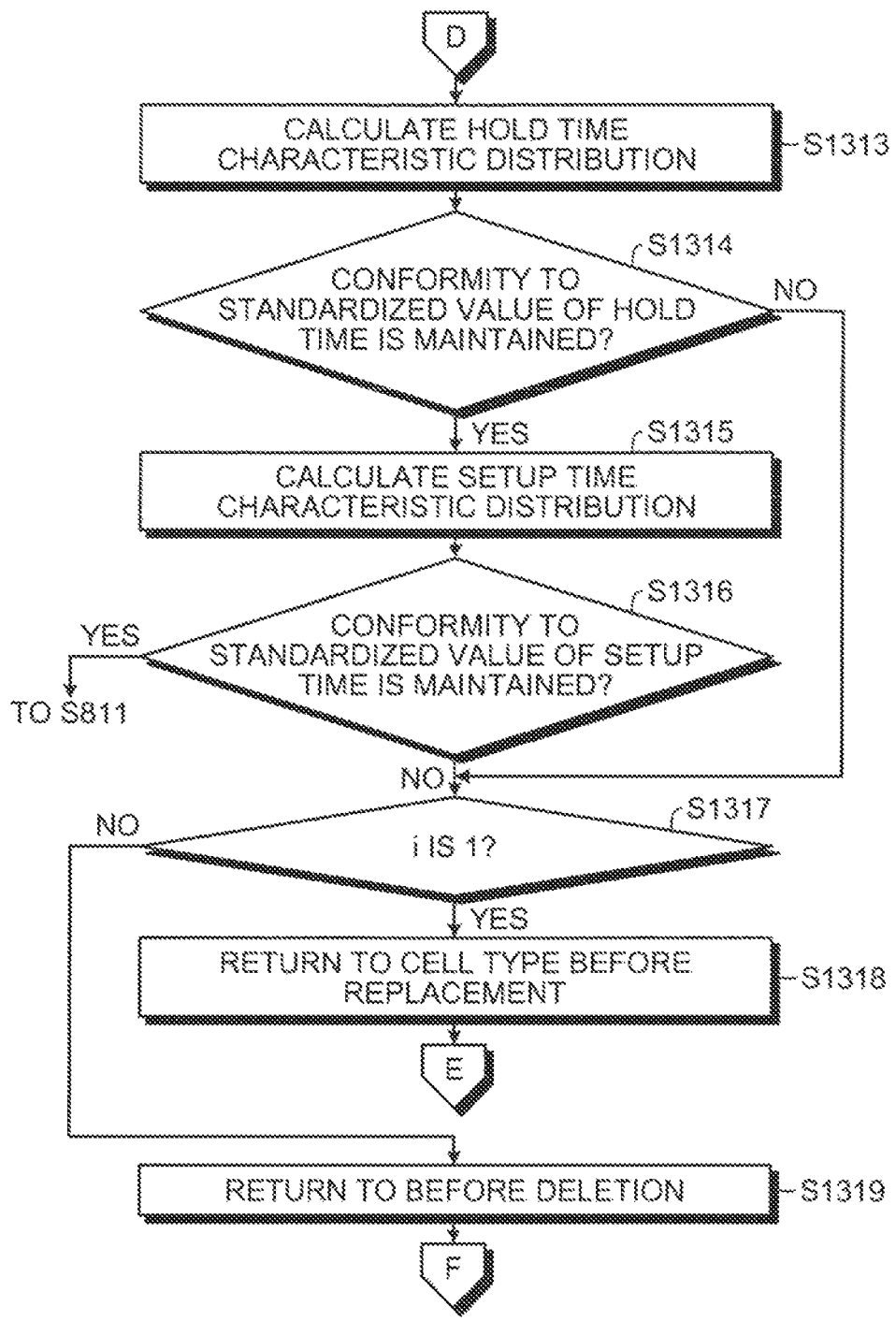
FIG. 14 is a flowchart of the detailed process procedure of the replacement process 3 (step S813) depicted in FIG. 8.

FIGS. 13 and 14 are flowcharts of the detailed process procedure of the replacement process 3 (step S813) depicted in FIG. 8. First, the selection process is executed (step S1301); the decision process is executed (step S1302); and any cell type having $\mu$ and $\sigma$ of the power consumption value smaller than those of the cell type of the object cell is retrieved (step S1303). It is then determined whether the cell type is retrieved (step S1304), and if it is determined that the cell type is not retrieved (step S1304: NO), any cell type having $\mu$ of the power consumption value smaller than that of the cell type of the object cell is retrieved (step S1305). It is determined whether the cell type is retrieved (step S1306).

If it is determined at step S1304 or S1306 that the cell types are retrieved (step S1304: YES, step S1306: YES), a cell type having the smallest $\sigma$ of the characteristic distribution of the delay value is selected from the retrieved cell types (step S1307). Subsequently, i=1 is set (step S1308); the replacing unit 504 replaces the cell type of the object cell (step S1309); and the procedure goes to step S1313 (step of FIG. 14).

On the other hand, if not retrieved (step S1306: NO), it is determined whether the object cell is a buffer (step S1310). If it is determined that the object cell is a buffer (step S1310: YES), i=3 is set (step S1311) and the deleting unit 508 deletes the object cell (step S1312) and the procedure goes to step S1313 (step of FIG. 14). On the other hand, if it is determined that the object cell is not a buffer (step S1310: NO), the objected cell is registered on the already-replaced list (step S1320) and the procedure returns to step S1301.

Referring to FIG. 14, subsequent to the step S1309 or S1312 described above, the calculating unit 506 calculates the hold time characteristic distribution (step S1313) and it is determined whether the conformity to the standardized value of the hold time is maintained (step 1314). If it is determined that the conformity to the standardized value of the hold time is maintained (step 1314: YES), the calculating unit 506 calculates the setup time characteristic distribution (step S1315) and it is determined whether the conformity to the standardized value of the setup time is maintained (step 1316).

If it is determined that the conformity to the standardized value of the hold time is not maintained (step 1314: NO) or if it is determined that the conformity to the standardized value of the setup time is not maintained (step 1316: NO), it is determined whether i is equal to 1 (step S1317). If it is determined that i is equal to 1 (step S1317: YES), the cell type is returned to that before the replacement (step S1318) and the procedure returns to step S1310 (step of FIG. 13). On the other hand, if it is determined that i is not equal to 1 (step S1317: NO), the cell type is returned to that before the deletion (step S1319) and the procedure goes to step S1320 (step of FIG. 13). On the other hand, if it is determined that the conformity to the standardized value of the setup time is maintained (step S1316: YES), the procedure returns to step S811.

Figure 15:
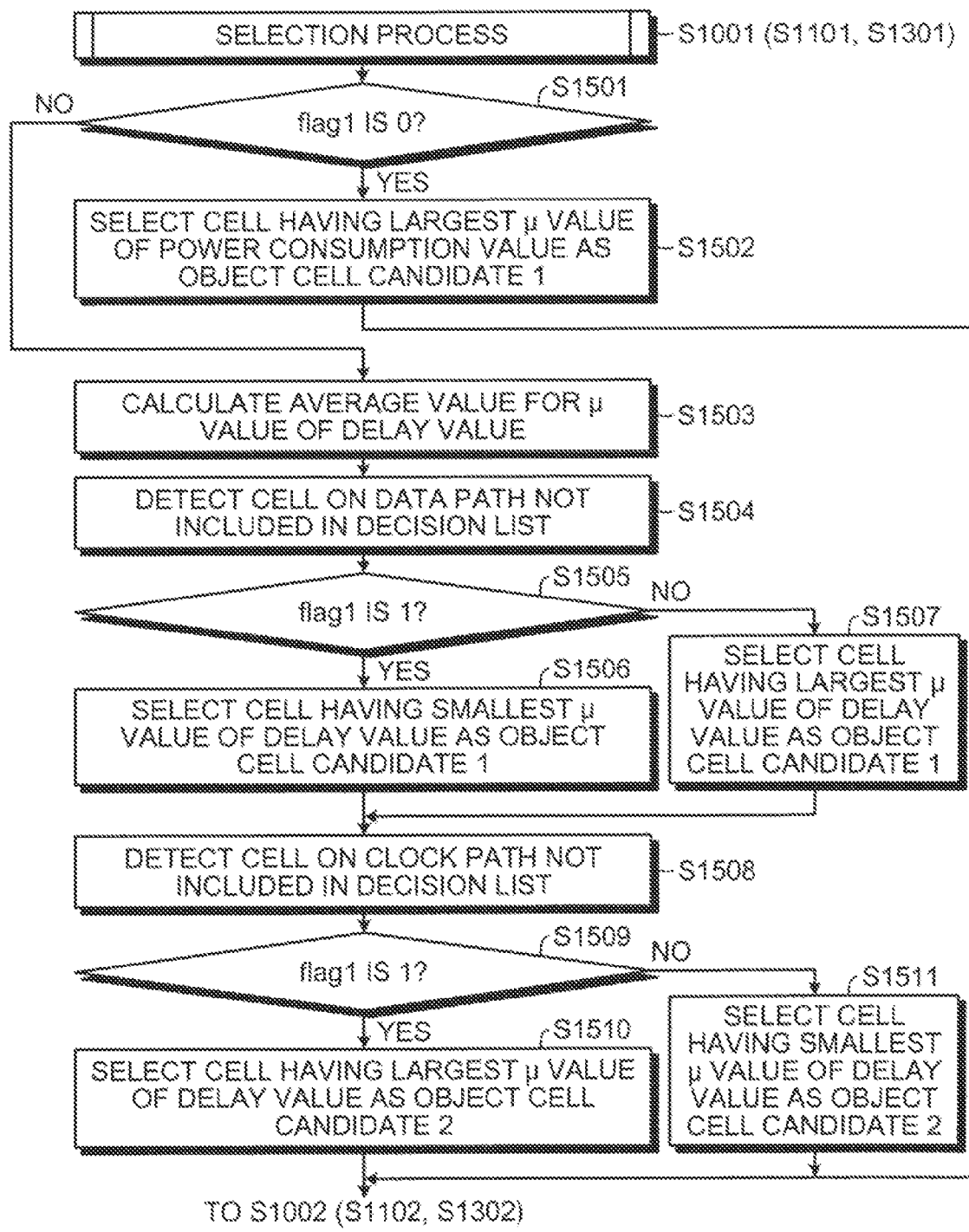
FIG. 15 is a flowchart of the detailed process procedure of a selection process.

The selection process (steps S1001, S1101, and S1301) depicted in FIGS. 10, 11, and 13 will be explained. FIG. 15 is a flowchart of the detailed process procedure of the selection process. First, it is determined whether flag1 is zero (step S1501). If it is determined that flag1 is zero (step S1501: YES), the cell having the largest $\mu$ of the power consumption value is selected as an object cell candidate 1 (step S1502) and the procedure goes to step S1002 (step S1102, step S1302).

On the other hand, if it is determined that flag1 is not zero (step S1501: NO), the average value is calculated for $\mu$ of the characteristic distribution of the delay value (step S1503) and any cell on the data path not included in a decision list is detected (step S1504). It is determined whether flag1 is equal to 1 (step S1505), and if flag1 is equal to 1 (step S1505: YES), the selecting unit 503 selects the cell having the smallest $\mu$ of the delay value as the object cell candidate 1 (step S1506).

If flag1 is not equal to 1 (step S1505: NO), the selecting unit 503 selects the cell having the largest $\mu$ of the delay value as the object cell candidate 1 (step S1507). Subsequent to step S1506 or S1507, any cell on any cell on the clock path not included in the decision list is detected (step S1508). It is determined whether flag1 is one (step S1509), and if flag1 is one (step S1509: YES), the selecting unit 503 selects the cell having the largest $\mu$ of the delay value as the object cell candidate 2 (step S1510).

On the other hand, if flag1 is not one (step S1509: NO), the selecting unit 503 selects the cell having the smallest $\mu$ of the delay value as the object cell candidate 2 (step S1511). Subsequent to step S1510 or S1511, the procedure goes to step S1002 (step S1102, step S1302).

The decision process (steps S1002, S1102, and S1302) depicted in FIGS. 10, 11, and 13 will be described. FIG. 16 is a flowchart of the detailed process procedure of the decision process. First, it is determined whether the object cell candidate 1 or 2 is selected or not (step S1601), and if it is determined as being selected (step S1601: YES), it is determined whether the object cell candidate 1 is selected (step S1602). If it is determined that the object cell candidate 1 is selected (step S1602: YES), it is determined whether the object cell candidate 2 is selected (step S1604). If it is determined that the object cell candidate 2 is selected (step S1604: YES), N=|average value of $\mu$ of delay values of cells included in the path –$\mu$ of delay value of the object cell candidate 1| is calculated (step S1605).

M=|average value of $\mu$ of delay values –$\mu$ of delay value of the object cell candidate 2| is then calculated (step S1606) to determined whether N≧M is satisfied (step S1607). If N≧M is not satisfied (step S1607: NO) or if it is determined that the object cell candidate 1 is not selected (step S1602: NO), the selecting unit 503 selects the object cell candidate 2 as the object cell (step S1609).

On the other hand, in the case of N≧M (step S1607: YES) or if the it is determined that the object cell candidate 2 is not selected (step S1604: NO), the selecting unit 503 selects the object cell candidate 1 as the object cell (step S1608). Subsequent to step S1608, the procedure goes to step S1003 (step S1103, step S1303).

On the other hand, if it is determined that the object cell candidate 1 or 2 is not selected (step S1601: NO), the output unit 510 outputs the inability of replacement (step S1603) and a series of processes is terminated.

In the third embodiment, the cell types of the cells are set based on μ of the delay value and the object cell selected from a circuit-under-design is replaced based on μ of the delay value. This enables characteristic information in violation of the restriction to be identified by the replacement of the cells from multiple types of characteristic information of a circuit-under-design irrespective of correlation between the different types.

Therefore, a type of characteristics in violation may be detected from multiple types of characteristic information and the respective characteristics may be improved. By performing the replacement based on μ of the delay values of the cells, the optimization may be performed such that the timing characteristics are improved. The constituent elements substantially identical to those described in the first or second embodiment will be denoted by substantially identical reference numerals and will not be repeated and the processes substantially identical to those described in the first or second embodiment will not be repeated. In the third embodiment, the respective standardized values of multiple types of the characteristics will be described by using the values substantially identical to those described in the first embodiment.

The setting unit 501 has a function of setting each cell in the circuit information of the circuit-under-design to a cell having the smallest μ of the characteristic distribution of the delay value among multiple cells having different characteristics. For example, the CPU 401 accesses a storage device to sequentially select the cells in the circuit-under-design 200. The storage device is then accessed to retrieve the cell type having the smallest μ of the characteristic distribution of the delay value from the table 300. The cell type of the selected cell is set to the retrieved cell type. The setting result is stored in the storage device such as the RAM 403, the magnetic disk 405, and the optical disk 407. This enables the establishment of a data path with shorter delays and a clock path corresponding to the data path.

The setting result is described with "cell names: cell types" as follows:
Cell1: BUF1,
Cell2: BUF1,
Cell3: BUF1,
Cell4: BUF1,
Cell5: BUF1.

The calculating unit 506 calculates multiple types of the characteristic distributions after the setting unit 501 sets the cell types. The calculating unit 506 has the function substantially identical to the function described in the first embodiment and therefore the repetitive explanation will be omitted. The determining unit 507 determines whether multiple types of the characteristic distributions conform to the standardized values of the respective characteristics. The determining unit 507 has the function substantially identical to the function described in the first embodiment and therefore the repetitive explanation will be omitted.

Multiple types of the characteristic distributions of the paths after the setting is substantially identical to the example of the setting result described in the second embodiment and therefore the explanation thereof will be omitted. Therefore, the hold timing slack characteristic distribution is in violation of the standardized value of the hold timing.

The detecting unit 502 has a function of detecting the path in violation of the hold timing. This is the function substantially identical to that described in the second embodiment and therefore the explanation thereof will be omitted. Therefore, the clock path 201 and the data path 202 are detected from the circuit-under-design 200.

The selecting unit 503 has a function of selecting a cell having the largest median value of the characteristic distribution of the delay value as the object cell from the cells on the clock path in violation of the hold timing detected by the detecting unit 502. The selecting unit 503 also has a function of selecting a cell having the smallest median value of the characteristic distribution of the delay value as the object cell from the cells on the data path. The selecting unit 503 has the function substantially identical to that described in the second embodiment and therefore the explanation thereof will be omitted. Therefore, the selecting unit 503 selects Cell1 from the data path 202 as the object cell candidate 1 and Cell4 from the clock path 201 as the object cell candidate 2.

Either the object cell candidate 1 on the data path 202 or the object cell candidate 2 on the clock path 201 is selected as an object cell. It is assumed that the selection criterion is substantially identical to the criterion described in the second embodiment. Therefore, since both Cell1 and Cell4 are BUF1, Cell1 is selected because Cell1 is a cell on the data path 202.

The replacing unit 504 has a function of replacing the object cell with a cell having the largest median value of the characteristic distribution of the delay value among the cells having the function substantially identical to and the characteristics different from the object cell if the object cell selected by the selecting unit 503 is a cell on the clock path. The replacing unit 504 also has a function of replacing the object cell with a cell having the smallest median value of the characteristic distribution of the delay value among the cells having the function substantially identical to and the characteristics different from the object cell if the object cell selected by the selecting unit 503 is a cell on the data path. As a result, the cell type of Cell1 is replaced from BUF1 to BUF2.

The cell types of the cells after the replacement are as follows:
Cell1: BUF2,
Cell2: BUF1,
Cell3: BUF1,
Cell4: BUF1,
Cell5: BUF1.

This enables the object cell to be replaced automatically with a cell capable of improving the characteristics of the hold timing, and the improvement of the partial circuit may be achieved by making multiple types of the characteristics conform to the restrictions at the similar time. Since the above function of the replacing unit 504 is the function in the case of the violation of the hold timing, the function of the replacing unit 504 in the case of the violation of the setup timing will be described later.

The calculating unit 506 has a function of calculating the hold timing slack characteristic distribution and the setup timing slack characteristic distribution based on the characteristic distribution of the delay values of the cells after the replacement by the replacing unit 504. The calculating unit 506 also has a function of calculating the characteristic distribution of the power consumption value based on the characteristic distribution of the power consumption values of the cells after the replacement by the replacing unit 504. The calculation unit 506 has the function substantially identical to the function described in the first embodiment and therefore the repetitive explanation will be omitted.

X3, Y3, and Z3 calculated based on the data path 202 and the clock path 201 after the replacement are as follows, where: X3 denotes the calculated equation of the hold timing slack; Y3 denotes the equation of the setup timing; and Z3 denotes the equation of the power consumption value:

$$X3=204+3.8\times a1+2.4\times a2;$$

$$Y3=304+5.8\times a1+3.4\times a2;$$

$$Z3=657+3.4\times b1+6.8\times b2.$$

The value of the equation of the hold timing slack at "μ−3σ", the value of the equation of the setup timing slack at "μ−3σ", and the value of the equation of the power consumption value at "μ+3σ" are as follows:

$$X3=185.4;$$

$$Y3=276.4;$$

$$Z3=687.6.$$

The determining unit 507 has the function substantially identical to the functions described in the first and second embodiments and therefore the explanation thereof will not be repeated. Since X3 is at least equal to Dhd_st, it is determined that the conformity to the standardized value of the hold timing is maintained. Since Y3 is at least equal to Dsu_st, it is determined that the setup timing slack characteristic distribution conforms to the standardized value of the setup timing. Since Z3 is at most equal to P_st, it is determined that the power consumption value characteristic distribution conforms to the standardized value of the power consumption value.

The output unit 510 has the function substantially identical to the functions described in the first and second embodiments and therefore the repetitive explanation will be omitted.

The function of the replacing unit 504 in the case of the violation of the setup timing will be described. In the case of the violation of the setup timing, the replacing unit 504 has a function of replacing the object cell with a cell having the smallest median value of the characteristic distribution of the delay value among the cells having the function substantially identical to and the characteristics different from the object cell if the object cell is a cell on the clock path.

This enables the automatic replacement with a cell capable of improving the characteristics of the setup timing, and the improvement of the partial circuit may be achieved by making multiple types of the characteristics conform to the restrictions.

The replacing unit 504 also has a function of replacing the object cell with a cell having the largest median value of the characteristic distribution of the delay value among the cells having the function substantially identical to and the characteristics different from the object cell if the object cell selected by the selecting unit 503 is a cell on the data path. Since the third embodiment is described taking as an example a case of an improper hold timing, a case of an improper setup timing will be omitted.

This enables the automatic replacement with a cell capable of improving the characteristics of the setup timing, and the improvement of the partial circuit may be achieved by making multiple types of the characteristics conform to the restrictions.

Although the third embodiment is different in the setting unit 501 and the replacing unit 504 compared to the process of the second embodiment, other processes are substantially identical and, therefore, the explanation of the design support process procedure using a flowchart will be omitted.

The fourth embodiment will be described in terms of an example of determining the cell type of the object cell based on μ of the characteristic distribution of the power consumption value from multiple cell types. In particular, an improper hold timing is taken as an example.

The fourth embodiment will be described with the following examples of a hold timing standardized value (Dhd_st), a setup timing standardized value (Dhu_st), and a power consumption value standardized value (P_st):

Dhd_st: 285;
Dsu_st: 250;
P_st: 750.

The setting unit 501 has a function of setting a cell type of each cell to a cell type having the smallest μ of the power consumption value characteristic distribution. For example, for example, the CPU 401 sequentially selects the cells in the circuit-under-design 200 to retrieve the cell type having the smallest μ of the power consumption value characteristic distribution. The cell type of the selected cell is set to the retrieved cell type. The setting result is stored in the storage device such as the RAM 403, the magnetic disk 405, and the optical disk 407.

The setting result is described with "cell names: cell types" as follows:
Cell1: BUF4,
Cell2: BUF4,
Cell3: BUF4,
Cell4: BUF4,
Cell5: BUF4.

As a result, each of the cells may be set to the cell type having the smallest μ of the power consumption value to reduce the power consumption value.

The calculating unit 506 has a function of calculating the hold timing slack characteristic distribution and the setup timing slack characteristic distribution based on the characteristic distribution of the delay value of the cell type set by the setting unit 501. The calculating unit 506 also has a function of calculating the characteristic distribution of the power consumption value based on the characteristic distribution of the power consumption value of the set cell type. The calculation unit 506 has the function substantially identical to the function described in the first to third embodiments and therefore the repetitive explanation will be omitted.

X4, Y4, and Z4 calculated based on the data path 202 and the clock path 201 after the setting are as follows, where X4 denotes the hold timing slack characteristic distribution; Y4 denotes the setup timing characteristic distribution; and Z4 denotes the power consumption value characteristic distribution.

$$X4=320+8\times a1+4\times a2,$$

$$Y4=480+12\times a1+6\times a2,$$

$$Z4=525+2.5\times b1+5 \therefore b2.$$

X4 and Y4 at "μ−3σ" and Z4 at "μ+3σ" are as follows:

$$X4=284,$$

$$Y4=426,$$

$$Z4=547.5.$$

Since X4 is less than Dhd_st and violates the restriction, the detecting unit 502 detects the data path 202 and the clock path 201 making up the circuit-under-design 200. The detecting unit 502 has the function substantially identical to the function described in the second embodiment and therefore will not be described in detail.

The selecting unit 503 executes the process substantially identical to the process described in the second embodiment and therefore the repetitive explanation will be omitted. Cell1 on the data path 202 is selected as the object cell candidate 1 and Cell4 on the clock path 201 is selected as the object cell candidate 2. Either the object cell candidate 1 or the object cell candidate 2 is selected as an object cell as described in the second embodiment. Therefore, the object cell candidate 1 is selected as the object cell.

The replacing unit 504 has a function of replacing the object cell with a cell having μ of the delay value smaller than μ of the delay value of the object cell among the cells having the function substantially identical to and the characteristics different from the object cell when the object cell selected by the selecting unit 503 is a cell on the clock path. The replacing unit 504 also has a function of replacing the object cell with a cell having μ of the delay value larger than μ of the delay value of the object cell among the cells having the function substantially identical to and the characteristics different from the object cell if the object cell selected by the selecting unit 503 is a cell on the data path.

For example, the CPU 401 acquires μ of the delay value of the cell type of the object cell from the table 300. If the object cell is a cell on the clock path, the cell types having μ of the delay value smaller than μ of the delay value of the object cell are retrieved from the table 300. Alternatively, if the object cell is a cell on the data path, the cell types having μ of the delay value larger than μ of the delay value of the object cell are retrieved from the table 300. The cell type of the object cell is replaced with an arbitrary cell type among the retrieved cell types.

The replacement result is stored in the storage device such as the RAM 403, the magnetic disk 405, and the optical disk 407. This described function of the replacing unit 504 is the function in the case of an improper hold timing, the function in the case of an improper setup timing will be described later.

The replacing unit 504 has a function of replacing the object cell with a cell having the smallest value of μ of the power consumption value among the cells having the function substantially identical to and the characteristics different from the object cell if the object cell selected by the selecting unit 503 is a cell on the clock path. For example, for example, the CPU 401 retrieves the cell type having the smallest value of μ of the power consumption value among the cell types from the table 300 except the cell type of the object cell. Therefore, BUF4 is retrieved from the table 300. For example, the CPU 401 replaces the cell type of the object cell with the retrieved cell type. The replacement result is stored in the storage device such as the RAM 403, the magnetic disk 405, and the optical disk 407.

For example, the object cell is Cell1 on the data path. Since Cell1 is BUF4, μ of the delay value 302 of BUF4 is read from the table 300. The μ of the delay value 302 of BUF4 is 110. The cell type 301 having μ of the delay value 302 larger than μ of the delay value 302 of the object cell is retrieved from the table 300. As a result, BUF3 is retrieved. Therefore, the cell type of Cell1 is replaced from BUF4 to BUF3. For example, if multiple cell types 301 having μ of the delay value 302 larger than μ of the delay value 302 of the object cell are retrieved from the table 300, the object cell may be replaced with the cell type 301 having the smallest μ of the power consumption value 303.

As a result, by automatically performing the replacement with the cell capable of most reducing the power consumption value, the characteristics of the power consumption value may be optimized while the setup timing slack and the hold timing slack may be made conform to the standardized values. Therefore, the partial circuit may be optimized such that the power consumption is reduced to achieve the improvement of the partial circuit.

The calculating unit 506 has the function substantially identical to the function described in the first to third embodiments and therefore will not be described in detail.

X5 denotes the equation of the hold timing slack; Y5 denotes the equation of the setup timing slack; and Z5 denotes the equation of the power consumption value.

$$X5=322+7.8 \times a1+4 \times a2,$$

$$Y5=482+13 \times a1+7.2 \times a2,$$

$$Z5=528+2.8 \times a1+4.7 \times a2.$$

X5 and Y5 at "μ−3σ" and Z5 at "μ+3σ" are as follows:

$$X5=286.6,$$

$$Y5=421.4,$$

$$Z5=550.5.$$

The determining unit 507 has the function substantially identical to the function described in the first to third embodiments and therefore will not be described in detail. Since X5 at "μ−3σ" is greater than Dhd_st, the hold timing slack characteristic distribution conforms to the restriction of the hold timing. Since Y5 at "μ−3σ" is greater than Dsu_st, the setup timing slack characteristic distribution conforms to the restriction of the setup timing. Since Z5 at "μ+3σ" is less than P_st, the power consumption value characteristic distribution conforms to the restriction of the power consumption value. Therefore, since multiple types of the characteristic distributions conform to the respective standardized values, the process is terminated.

For example, since the value at "μ+3σ" of the power consumption value characteristic distribution in the fourth embodiment is smaller than that of the third embodiment, it is known that a larger margin exists for the standardized value of the power consumption value. Therefore, by determining the cell types of the cells based on the characteristics of the power consumption values of the cells, multiple types of characteristics may conform to the respective standardized values and the characteristics of the power consumption value may particularly be emphasized and optimized.

The output unit 510 has the function substantially identical to the function described in the first to third embodiments and therefore will not be described in detail.

The case of an improper setup timing will be described. The replacing unit 504 has a function of replacing the object cell with a cell having μ of the delay value larger than μ of the delay value of the object cell among the cells having the function substantially identical to and the characteristics different from the object cell if the object cell selected by the selecting unit 503 is a cell on the clock path. The replacing unit 504 also has a function of replacing the object cell with a cell having μ of the delay value smaller than μ of the delay value of the object cell among the cells having the function substantially identical to and the characteristics different from the object cell if the object cell selected by the selecting unit 503 is a cell on the data path.

For example, the CPU 401 acquires μ of the delay value of the cell type of the object cell from the table 300. If the object cell is a cell on the clock path, the cell types having μ of the delay value larger than μ of the delay value of the object cell are retrieved from the table 300. Alternatively, if the object cell is a cell on the data path, the cell types having μ of the delay value smaller than μ of the delay value of the object cell are retrieved from the table 300. The cell type of the object cell is replaced with an arbitrary cell type among the retrieved cell types.

The replacement result is stored in the storage device such as the RAM 403, the magnetic disk 405, and the optical disk 407. The functions of the determining unit 507 and the output unit 510 are substantially identical to the functions described above and will not be described.

Although the fourth embodiment has differences in the setting unit 501 and the replacing unit 504 from the process described in the second and third embodiments, other processes are substantially identical and, therefore, the design support process procedure will not be described by using a flowchart.

As described above, according to the design support program, the design support method, and the design support apparatus, an arbitrary cell is selected as an object cell from a data path and a clock path making up a partial circuit and is replaced with a cell having a function substantially identical to and the characteristics different from the object cell. The characteristics in violation of the restriction may be identified from multiple types of characteristics by determining whether multiple types of characteristic distributions related to the partial circuit after the replacement are in violation of the respective restrictions. The improvement of the partial circuit may be achieved by making multiple characteristics conform to the restrictions at the similar time.

If it is determined that at least one type of the characteristic distribution is in violation of the restriction, the object cell is newly replaced with a cell having different characteristics and it is determined whether multiple types of the characteristic distributions of the partial circuit after the replacement are in violation of the respective restrictions. This enables multiple characteristics to conform to the restrictions at the similar time and the improvement of the partial circuit may be achieved.

If it is determined that at least one type of the characteristic distribution is in violation of a restriction, the object cell is newly selected from cells on the data path and the clock path and it is determined whether multiple types of the characteristic distributions of the partial circuit after the replacement are in violation of the respective restrictions. This enables multiple characteristics to conform to the restrictions at the similar time and the improvement of the partial circuit may be achieved.

The object cell is replaced with a cell having the smallest σ of the characteristic distribution of the delay value among cells having the function substantially identical to and the characteristics different from the object cell. This may reduce the occurrence of variations in the characteristics of the hold timing slack and the setup timing slack while the power consumption value characteristic distribution may be made conform to the standardized value. Therefore, the partial circuit may be optimized such that the variations are reduced in the timing characteristics to achieve the improvement of the partial circuit.

The data path and the clock path are detected that make up the partial circuit but are in violation of the restriction of the hold timing from the circuit-under-design. Either the cell having the largest μ of the delay value among cells on the clock path or the cell having the smallest μ of the delay value among cells on the data path is selected as an object cell.

As a result, the cell having the largest impact on the hold timing slack may automatically be selected from the clock path and the data path. Therefore, the characteristics of the hold timing slack may be improved and the improvement of the partial circuit may be achieved by making the setup timing slack and the power consumption value conform to the restrictions at the similar time.

In the case of the violation of the hold timing, if the object cell is a cell on the clock path, the object cell is replaced such that μ of the delay value is increased. If the object cell is a cell on the data path, the object cell is replaced such that μ of the delay value is reduced.

This enables the object cell to be replaced automatically with a cell capable of improving the characteristics of the hold timing and the improvement of the partial circuit may be achieved by making multiple types of the characteristics conform to the restrictions.

In the case of the violation of the hold timing, if the object cell is a cell on the clock path, the object cell is replaced with the cell having the largest μ of the delay value among cells having the function substantially identical to and the characteristics different from the object cell. If the object cell is a cell on the data path, the object cell is replaced with the cell having the smallest μ of the delay value among cells having the function substantially identical to and the characteristics different from the object cell.

This enables the automatic replacement with a cell capable of improving the characteristics of the hold timing and the improvement of the partial circuit may be achieved by making multiple types of the characteristics conform to the restrictions.

The data path and the clock path are detected that make up the partial circuit in violation of the restriction of the setup timing from the circuit-under-design. Either the cell having the smallest μ of the delay value among cells on the clock path or the cell having the largest μ of the delay value among cells on the data path is selected as the object cell.

As a result, the cell having the largest impact on the setup timing slack may automatically be selected from the clock path and the data path. Therefore, the characteristics of the setup timing slack may be improved and the improvement of the partial circuit may be achieved by making the hold timing slack and the power consumption value conform to the restrictions at the similar time.

In the case of the violation of the setup timing, if the object cell is a cell on the clock path, the object cell is replaced such that μ of the delay value is reduced. If the object cell is a cell on the data path, the object cell is replaced such that μ of the delay value is increased. This enables the automatic replacement with a cell capable of improving the characteristics of the setup timing and the improvement of the partial circuit may be achieved by making multiple types of the characteristics conform to the restrictions.

In the case of the violation of the setup timing, if the object cell is a cell on the clock path, the object cell is replaced with the cell having the smallest μ of the delay value among cells having the function substantially identical to and the characteristics different from the object cell. If the object cell is a cell on the data path, the object cell is replaced with the cell having the largest μ of the delay value among cells having the function substantially identical to and the characteristics different from the object cell.

This enables the automatic replacement with a cell capable of improving the characteristics of the setup timing and the improvement of the partial circuit may be achieved by making multiple types of the characteristics conform to the restrictions.

The object cell is replaced with a cell having the smallest μ of the power consumption value among cells having the function substantially identical to and the characteristics different from the object cell. As a result, by automatically performing the replacement with the cell capable of most reducing the power consumption value, the characteristics of the power consumption value may be optimized while the setup timing slack and the hold timing slack may be made conform to the standardized values. Therefore, the partial circuit may be optimized such that the power consumption is reduced to achieve the improvement of the partial circuit.

It is determined whether the specified type of the characteristic distribution after the object cell is replaced has a larger margin from the standardized value than the specified type of the characteristic distribution before the object cell is replaced. This enables the optimization of the characteristic distribution of the type specified by a user while the characteristic distributions of the other types are made conform to the standardized values. Therefore, the improvement of the partial circuit may be achieved as needed by the user.

By automatically calculating multiple types of the characteristic information based on the characteristics of cells, the characteristics in violation of the standardized value may be identified.

The functions described in the first to fourth embodiments may be implemented for circuit information after the initial arrangement is performed and the clock tree is generated through the layout design. Therefore, the characteristics in the violation of the restriction may be identified from multiple types of characteristics during the initial stage of the layout design and the design period may be shortened with less backset even if a circuit change is made.

The method explained in the present embodiments may be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program may be a transmission medium that may be distributed through a network such as the Internet.

The embodiments have an effect of making multiple types of characteristics distribution of a partial circuit conform to a restriction at the similar time irrespective of correlation between the characteristics to achieve improvement of the partial circuits.

All examples and conditional language recited herein are intended for pedagogical purposes to aid the reader in understanding the invention and the concepts contributed by the inventor to furthering the art, and are to be construed as being without limitation to such for example recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium storing a design support program, wherein the design support program, when executed by a computer, enables the computer to perform operations comprising:
   detecting a data path and a clock path corresponding to the data path making up a partial circuit in a circuit-under-design;
   selecting an object cell from cells on the data path and the clock path detected in the detecting;
   replacing the object cell selected in the selecting with a cell having a function substantially identical to and characteristics different from the object cell;
   acquiring a plurality of types of characteristic information related to the partial circuit based on the data path and the clock path after the object cell is replaced in the replacing;
   determining whether the types of the characteristic information acquired in the acquiring is in violation of restrictions; and
   outputting a determination result determined in the determining.

2. The non-transitory computer-readable recording medium according to claim 1, wherein
   if in the determining, it is determined that at least one type of characteristic information is in violation of a restriction of the characteristic information, in the replacing, replacement is performed with a cell having a function substantially identical to and characteristics different from the object cell except replaced cells, and wherein
   in the acquiring, a plurality of types of characteristic information related to the partial circuit is acquired based on the data path and the clock path after the object cell is replaced, and wherein
   in the determining, it is determined whether the types of the characteristic information acquired in the acquiring are in violation of the restrictions.

3. The non-transitory computer-readable recording medium according to claim 1, wherein
   if in the determining, it is determined that at least one type of characteristic information is in violation of a restriction of the characteristic information, in the selecting, an object cell is selected from cells on the data path and the clock path.

4. The non-transitory computer-readable recording medium according to claim 1, wherein
   in the replacing, the object cell is replaced with a cell having the smallest standard deviation of the characteristic distribution of the delay value among cells having a function substantially identical to and characteristics different from the object cell, and wherein
   in the acquiring, a plurality of types of characteristic information related to the partial circuit is acquired based on the data path and the clock path after the object cell is replaced in the replacing.

5. The non-transitory computer-readable recording medium according to claim 1, wherein
   in the detecting, a data path and a clock path corresponding to the data path making up a partial circuit having a hold timing slack characteristic distribution in violation of the restriction of hold timing are detected from the circuit-under-design, and wherein
   in the selecting, either a cell having the largest median value of the characteristic distribution of the delay value among cells on the clock path detected in the detecting or a cell having the smallest median value of the characteristic distribution of the delay value among cells on the data path detected in the detecting is selected as the object cell.

6. The non-transitory computer-readable recording medium according to claim 1, wherein
   in the replacing, the object cell is replaced with a cell having a smaller median value of the characteristic distribution of the delay value than the median value of the characteristic distribution of the delay value of the object cell among cells having a function substantially identical to and characteristics different from the object cell if the object cell selected in the selecting is a cell on the clock path and replaces the object cell with a cell having a larger median value of the characteristic distribution of the delay value than the median value of the characteristic distribution of the delay value of the object cell among cells having a function substantially identical to and characteristics different from the object cell if the object cell is a cell on the data path.

7. The non-transitory computer-readable recording medium according to claim 1, wherein
in the replacing, the object cell is replaced with a cell having the smallest median value of the characteristic distribution of the delay value among cells having a function substantially identical to and characteristics different from the object cell if the object cell selected in the selecting is a cell on the clock path and replaces the object cell with a cell having the largest median value of the characteristic distribution of the delay value among cells having a function substantially identical to and characteristics different from the object cell if the object cell is a cell on the data path.

8. The non-transitory computer-readable recording medium according to claim 1, wherein
in the detecting, a data path and a clock path corresponding to the data path making up a partial circuit having a setup timing slack characteristic distribution in violation of the restriction of setup timing is selected from the circuit-under-design, and wherein
in the selecting, either a cell having the smallest median value of the characteristic distribution of the cell delay value among cells on the clock path detected in the detecting or a cell having the largest median value of the characteristic distribution of the cell delay value among cells on the data path detected in the detecting is selected as the object cell.

9. The non-transitory computer-readable recording medium according to claim 1, wherein
in the replacing, the object cell is replaced with a cell having a larger median value of the characteristic distribution of the delay value than the median value of the characteristic distribution of the delay value of the object cell among cells having a function substantially identical to and characteristics different from the object cell if the object cell selected in the selecting is a cell on the clock path and replaces the object cell with a cell having a smaller median value of the characteristic distribution of the delay value than the median value of the characteristic distribution of the delay value of the object cell among cells having a function substantially identical to and characteristics different from the object cell if the object cell is a cell on the data path, and wherein
in the acquiring, a plurality of types of characteristic information related to the partial circuit is acquired based on the data path and the clock path after the object cell is replaced in the replacing.

10. The non-transitory computer-readable recording medium according to claim 1, wherein
in the replacing, the object cell is replaced with a cell having the largest median value of the characteristic distribution of the delay value among cells having a function substantially identical to and characteristics different from the object cell if the object cell selected in the selecting is a cell on the clock path and replaces the object cell with a cell having the smallest median value of the characteristic distribution of the delay value among cells having a function substantially identical to and characteristics different from the object cell if the object cell is a cell on the data path, and wherein
in the acquiring, a plurality of types of characteristic information related to the partial circuit is acquired based on the data path and the clock path after the object cell is replaced in the replacing.

11. The non-transitory computer-readable recording medium according to claim 1, wherein
in the replacing, the object cell selected in the selecting is replaced with a cell having the smallest median value of the characteristic distribution of the power consumption value among cells having a function substantially identical to and characteristics different from the object cell, and wherein
in the acquiring, a plurality of types of characteristic information related to the partial circuit is acquired based on the data path and the clock path after the object cell is replaced in the replacing.

12. The non-transitory computer-readable recording medium according to claim 1, wherein
in the acquiring, a specified type of characteristic information of a partial circuit before replacement is acquired, and wherein
in the determining, it is determined whether the specified type of characteristic information of the partial circuit before the replacement has a larger margin from a standardized value than the specified type of characteristic information of the path before the replacement acquired in the acquiring.

13. The non-transitory computer-readable recording medium according to claim 1, wherein
the computer is caused to perform a plurality of types of characteristic information based on the data path and the clock path after the object cell is replaced in the replacing, and wherein
in the determining, it is determined whether the types of the characteristic information calculated in the calculating is in violation of the restrictions.

14. A design support apparatus comprising:
a detecting unit that detects a data path and a clock path corresponding to the data path making up a partial circuit in a circuit-under-design;
a selecting unit that selects an object cell from cells on the data path and the clock path detected by the detecting unit;
a replacing unit that replaces the object cell selected by the selecting unit with a cell having a function substantially identical to and characteristics different from the object cell;
an acquiring unit that acquires a plurality of types of characteristic information related to the partial circuit based on the data path and the clock path after the object cell is replaced by the replacing unit;
a determining unit that determines whether the types of the characteristic information acquired by the acquiring unit is in violation of restrictions; and
an output unit that outputs a determination result determined by the determining unit.

15. A design support method comprising:
detecting, by using a computer, a data path and a clock path corresponding to the data path making up a partial circuit in a circuit-under-design;
selecting an object cell from cells on the data path and the clock path detected in the detecting;
replacing the object cell selected in the selecting with a cell having a function substantially identical to and characteristics different from the object cell;

acquiring a plurality of types of characteristic information related to the partial circuit based on the data path and the clock path after the object cell is replaced in the replacing;

determining whether the types of the characteristic information acquired in the acquiring is in violation of restrictions; and outputting a determination result determined in the determining.

* * * * *